(12) United States Patent
Hayakawa et al.

(10) Patent No.: US 9,515,081 B2
(45) Date of Patent: Dec. 6, 2016

(54) SEMICONDUCTOR DEVICE AND METHOD FOR MANUFACTURING THEREOF

(71) Applicant: Cypress Semiconductor Corporation, San Jose, CA (US)

(72) Inventors: Yukio Hayakawa, Aizuwakamatsu (JP); Yukihiro Utsuno, Aizuwakamatsu (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/628,939

(22) Filed: Feb. 23, 2015

(65) Prior Publication Data

US 2015/0270278 A1    Sep. 24, 2015

Related U.S. Application Data

(62) Division of application No. 12/049,089, filed on Mar. 14, 2008, now Pat. No. 8,994,093.

(30) Foreign Application Priority Data

Mar. 15, 2007    (JP) ................................. 2007-067151

(51) Int. Cl.
*H01L 29/792* (2006.01)
*H01L 21/28* (2006.01)
(Continued)

(52) U.S. Cl.
CPC ..... *H01L 27/11568* (2013.01); *H01L 21/0217* (2013.01); *H01L 21/0223* (2013.01); *H01L 21/02164* (2013.01); *H01L 21/28282* (2013.01); *H01L 21/31111* (2013.01); *H01L 21/31144* (2013.01); *H01L 21/768* (2013.01); *H01L 23/528* (2013.01); *H01L 27/115* (2013.01); *H01L 29/42352* (2013.01); *H01L 29/511* (2013.01); *H01L 29/513* (2013.01); *H01L 29/518* (2013.01); *H01L 29/7923* (2013.01); *H01L 2924/0002* (2013.01)

(58) Field of Classification Search
CPC H01L 21/28282; H01L 27/115; H01L 29/511; H01L 29/7923
See application file for complete search history.

(56) References Cited

U.S. PATENT DOCUMENTS 6,773,988 B1   8/2004  Sahota et al.
8,994,093 B2   3/2015  Hayakawa et al.
(Continued)

OTHER PUBLICATIONS

USPTO Final Rejection for U.S. Appl. No. 12/049,089 dated Feb. 25, 2013; 7 pages.
(Continued)

*Primary Examiner* — Raj R Gupta

(57) ABSTRACT

A semiconductor device includes bit lines provided in a semiconductor substrate; an ONO film that is provided along the surface of the semiconductor substrate and is made of a tunnel oxide film, a trap layer, and a top oxide film; and an oxide film that is provided on the surface of the semiconductor substrate in the middle between the bit lines and contacts the side face of the ONO film, in which the film thickness of the oxide film is larger than the sum of the thicknesses of the tunnel oxide film and the top oxide film, and smaller than the thickness of the ONO film.

20 Claims, 22 Drawing Sheets

(51) Int. Cl.
*H01L 27/115* (2006.01)
*H01L 29/423* (2006.01)
*H01L 29/51* (2006.01)
*H01L 21/02* (2006.01)
*H01L 21/311* (2006.01)
*H01L 21/768* (2006.01)
*H01L 23/528* (2006.01)

(56) References Cited

U.S. PATENT DOCUMENTS

| | | | |
|---|---|---|---|
| 2002/0084484 A1* | 7/2002 | Kurihara | H01L 21/28282 257/315 |
| 2004/0002182 A1 | 1/2004 | Lai | |
| 2005/0030780 A1 | 2/2005 | Deppe et al. | |
| 2005/0104117 A1 | 5/2005 | Mikolajick et al. | |
| 2007/0117353 A1* | 5/2007 | Wang | H01L 21/28282 438/467 |
| 2007/0121386 A1 | 5/2007 | Ho et al. | |
| 2007/0247923 A1 | 10/2007 | Ding et al. | |
| 2008/0224275 A1 | 9/2008 | Hayakawa et al. | |

OTHER PUBLICATIONS

USPTO Final Rejection for U.S. Appl. No. 12/049,089 dated Mar. 4, 2011; 8 pages.
USPTO Final Rejection for U.S. Appl. No. 12/049,089 dated Mar. 7, 2014; 8 pages.
USPTO Final Rejection for U.S. Appl. No. 12/049,089 dated Apr. 11, 2012; 7 pages.
USPTO Final Rejection for U.S. Appl. No. 12/049,089 dated May 19, 2010; 7 pages.
USPTO Final Rejection for U.S. Appl. No. 12/049,089 dated Aug. 28, 2014; 8 pages.
USPTO Final Rejection for U.S. Appl. No. 12/049,089 dated Sep. 5, 2013; 8 pages.
USPTO Non-Final Rejection for U.S. Appl. No. 12/049,089 dated Jan. 8, 2010; 7 pages.
USPTO Non-Final Rejection for U.S. Appl. No. 12/049,089 dated Jan. 25, 2012; 7 pages.
USPTO Non-Final Rejection for U.S. Appl. No. 12/049,089 dated Jun. 2, 2014; 9 pages.
USPTO Non-Final Rejection for U.S. Appl. No. 12/049,089 dated Jun. 4, 2013; 7 pages.
USPTO Non-Final Rejection for U.S. Appl. No. 12/049,089 dated Sep. 24, 2010; 6 pages.
USPTO Non-Final Rejection for U.S. Appl. No. 12/049,089 dated Nov. 22, 2013; 8 pages.
USPTO Notice of Allowance for U.S. Appl. No. 12/049,089 dated Nov. 20, 2014; 9 pages.

* cited by examiner

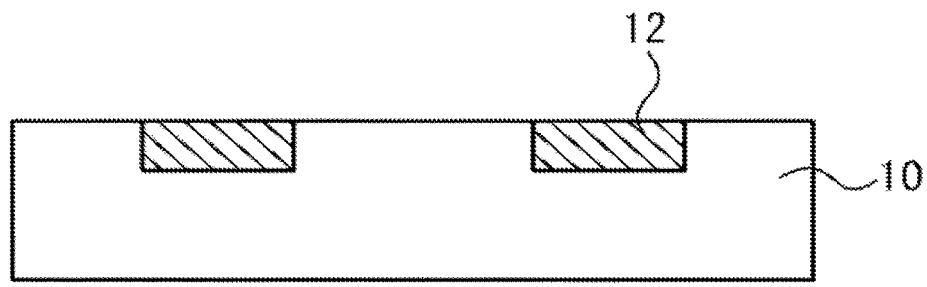
FIG. 4A
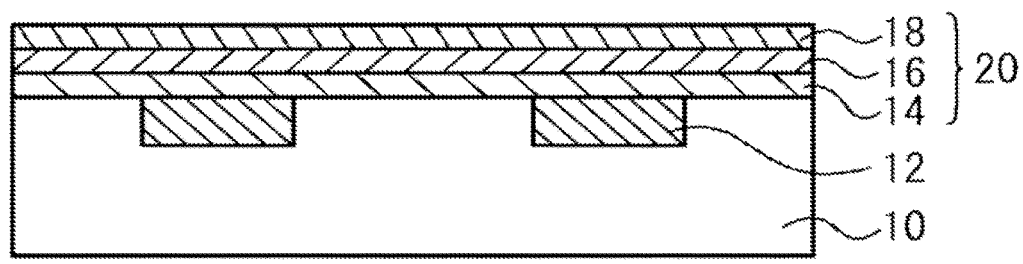
FIG. 4B
FIG. 4C
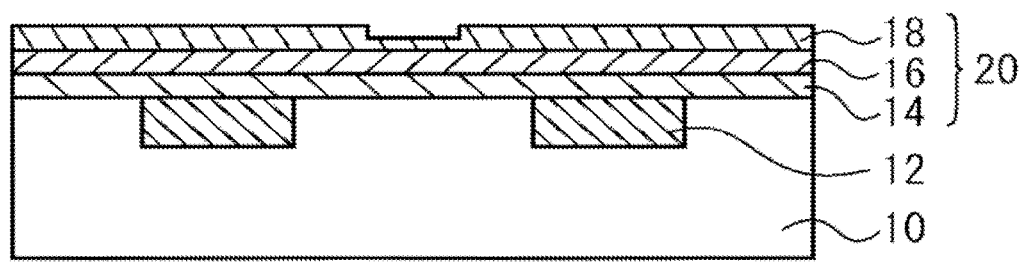

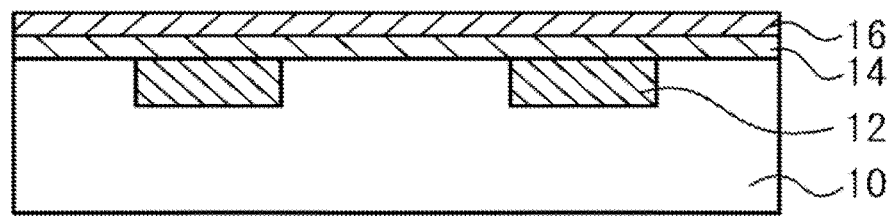
FIG. 6A
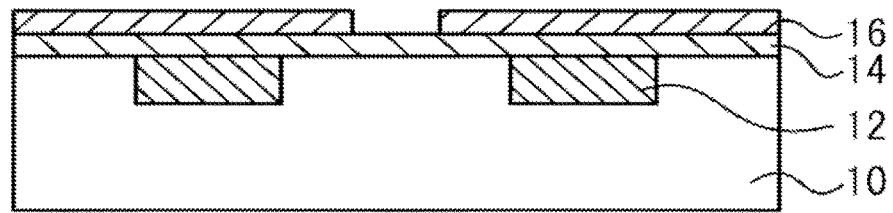
FIG. 6B
FIG. 6C
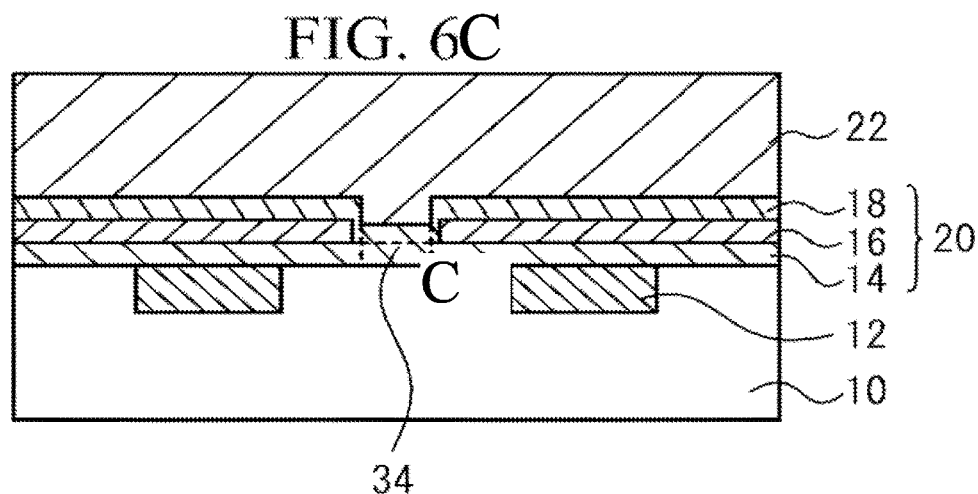

*1 LOW-TEMPERATURE RADICAL OXIDATION THROUGH THERMAL OXIDE FILM (7.6 nm)

*2 DIRECT LOW-TEMPERATURE RADICAL OXIDATION ON Si SUBSTRATE

SEMICONDUCTOR DEVICE AND METHOD FOR MANUFACTURING THEREOF

CROSS-REFERENCE TO RELATED APPLICATIONS

The present invention is a divisional application of U.S. application Ser. No. 12/049,089 filed Mar. 14, 2008, which is based on Japanese Patent Application No. 2007-067151 filed on Mar. 15, 2007, each of which are hereby incorporated by reference.

TECHNICAL FIELD

The present invention relates to a semiconductor device and its manufacturing method, and more particularly to a semiconductor device provided with a nonvolatile memory in which each transistor has two charge storage areas, as well as its manufacturing method.

BACKGROUND

In recent years, nonvolatile memories, which are semiconductor devices that keep stored data even if the power is turned off, are widely used. In a flash memory, which is a typical nonvolatile memory, each transistor constituting a memory cell has a floating gate or an insulating film called a charge storage layer. Data storage is performed by storing electrons in such charge storage layers. As a flash memory having a charge storage layer formed of an insulating film, there is a flash memory of a silicon-oxide-nitride-oxide-silicon (SONOS) structure in which a trap layer in an oxide-nitride-oxide (ONO) film stores electrons. As a flash memory of SONOS structure, U.S. Pat. No. 6,011,725 discloses a flash memory (related-art example) having a virtual ground memory cell that symmetrically drives a source and a drain that are replaced with each other.

FIG. 1 is a cross-sectional view of a flash memory according to the related-art example. With reference to FIG. 1, a semiconductor substrate 10 is provided with a bit line 12 used as both the source and the drain. On the semiconductor substrate 10 is provided an ONO film 20 made of a tunnel oxide film 14, a trap layer 16, and a top oxide film 18. On the ONO film 20 is a word line 22 that also serves as a gate.

As a method of writing data in the flash memory, there is a method of injecting electrons into the trap layer 16 using the hot electron effect or the Fowler-Nordheim (F-N) tunnel effect. Furthermore, as a method of erasing data, there is a method of removing electrons from the trap layer 16 using the hot hole effect or the F-N tunnel effect. Generally in the related-art example, the data writing method uses the method of injecting electrons into the trap layer 16 using the hot electron effect. According to this method, electrons can be injected into two charge storage areas 24 independently of each other, by interchanging the source and the drain between the bit line 12 (BL1) and the bit line 12 (BL2). Therefore, two bits can be stored in one transistor. In addition, the data erasing method generally uses the method of removing electrons from the trap layer 16 using the hot hole effect.

With high integration and miniaturization of memory cells, the length of a channel 26 is reduced resulting in an approach between two charge storage areas 24. Consequently, the electrons stored in the two charge storage areas 24 interfere with each other. As a result, it becomes difficult to distinguish the electrons stored in the areas from each other (that is, to read data distinctly).

In addition, with the method of data erasing using the hot hole effect, a punch-through phenomenon occurs when the length of the channel 26 is reduced. The punch-through phenomenon refers to a phenomenon in which the electric current becomes uncontrollable because the depletion layers of the bit line 12 (BL1) and the bit line 12 (BL2) connect with each other when a high electric field is applied between the bit lines 12 (between BL1 and BL2). Because of this phenomenon, the erasing efficiency of electrons significantly drops. If data erase is performed using the F-N tunnel effect, there occurs an apparent excessive erasing in which holes appear to accumulate in the middle of the trap layer 16 between the bit lines 12. This occurs because electrons are not accumulated in the middle of the trap layer 16 between the bit lines 12. With the method of accumulating electrons in the trap layer 16 using the hot electron effect, the excessive erasing continues once it occurs because electrons cannot be injected into the middle of the trap layer 16 between the bit lines 12. Therefore basically, the F-N tunnel effect cannot be practically applied for data erasing. As described above, the related-art example has a problem that it is difficult to highly densify and miniaturize memory cells.

SUMMARY

The present invention takes the above problem into consideration and aims to provide a semiconductor device that enables high integration and miniaturization of memory cells, as well as its manufacturing method.

According to an aspect of the present invention, there is provided a semiconductor device including: a semiconductor substrate; bit lines provided in the semiconductor substrate; an ONO film that is provided along a surface of the semiconductor substrate and includes a tunnel oxide film, a trap layer made of a nitride film, and a top oxide film; and an oxide film that is provided on the surface of the semiconductor substrate in a middle portion between the bit lines along the surface of the semiconductor substrate and contacts a side face of the ONO film. The film thickness of the oxide film is larger than the sum of the thicknesses of the tunnel oxide film and the top oxide film, and smaller than the thickness of the ONO film. According to the present invention, interference of electrons accumulated in a charge storage area can be suppressed, and electrons can be removed from a charge storage layer by the F-N tunnel effect. Therefore, high integration and miniaturization of memory cells become possible.

According to another aspect of the present invention, there is provided a semiconductor device including: a semiconductor substrate; bit lines provided in the semiconductor substrate; and an ONO film that is provided along a surface of the semiconductor substrate and includes a tunnel oxide film, a trap layer made of a nitride film, and a top oxide film. The film thickness of the trap layer in a middle portion between the bit lines along the surface of the semiconductor substrate is smaller than the thickness of the trap layer in portions in contact with the bit lines. According to this aspect of the present invention, the amount of electrons accumulated in the trap layer in the middle between the bit lines can be reduced. Therefore, interference of electrons accumulated in a charge storage area can be mitigated.

According to yet another aspect of the present invention, there is provided a manufacturing method of a semiconductor device including: forming bit lines in a semiconductor substrate; forming along a surface of the semiconductor substrate an ONO film that includes a tunnel oxide film, a trap layer made of a nitride film, and a top oxide film;

etching the top oxide film in a middle portion between the bit lines along the surface of the semiconductor substrate; and oxidizing the trap layer under a portion where the top oxide film is etched. According to this aspect of the present invention, it is easy to form in the middle between the bit lines an oxide film whose thickness is larger than the sum of the thicknesses of the tunnel oxide film and the top oxide film and smaller than the thickness of the ONO film.

According to a further aspect of the present invention, there is provided a manufacturing method of a semiconductor device including: forming on a surface of a semiconductor substrate an ONO film that includes a tunnel oxide film, a trap layer made of a nitride film, and a top oxide film; forming a mask layer on the ONO film; forming bit lines in the semiconductor substrate using the mask layer as a mask; forming on the bit lines an insulating film that is penetrating the ONO film, defined by the mask layer, and thicker than the ONO film; etching the top oxide film using as a mask a first sidewall layer provided on a sidewall of the insulating film on the ONO film; and oxidizing the trap layer under a portion where the top oxide film is etched. According to this aspect of the present invention, it is possible to form an oxide film self-aligned to the bit lines whose thickness is larger than the sum of the thicknesses of the tunnel oxide film and the top oxide film and smaller than the thickness of the ONO film.

BRIEF DESCRIPTION OF THE DRAWINGS

FIG. 4A to FIG. 4C are cross-sectional views (No. 1) showing a manufacturing process of a flash memory according to the first embodiment.

FIG. 6A to FIG. 6C are cross-sectional views showing a manufacturing process of a flash memory according to a comparative example.

FIGS. 9A and 9B are pattern diagrams showing electric field intensity distributions in data erase using the F-N tunnel effect, of which FIG. 9A is for a flash memory according to the first embodiment, and FIG. 9B is for a flash memory according to a comparative example.

DETAILED DESCRIPTION

Described below are embodiments of the present invention with reference to the drawings.

First Embodiment

Figure 1:
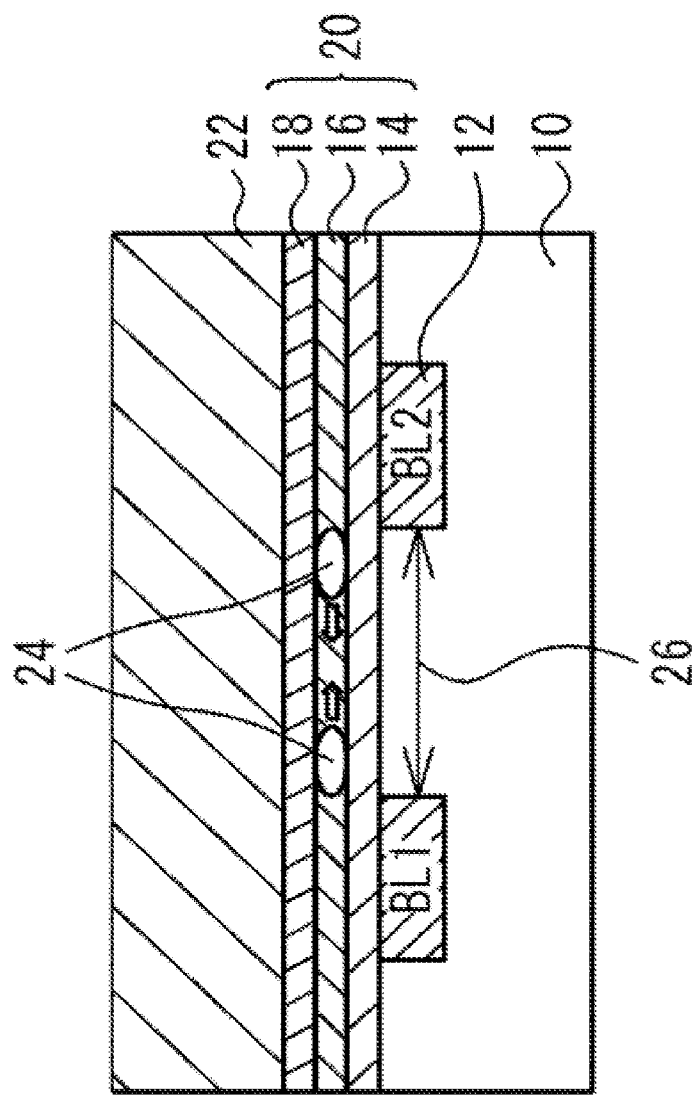
FIG. 1 is a cross-sectional view showing a problem of a flash memory according to a related-art example.
Figure 2A:
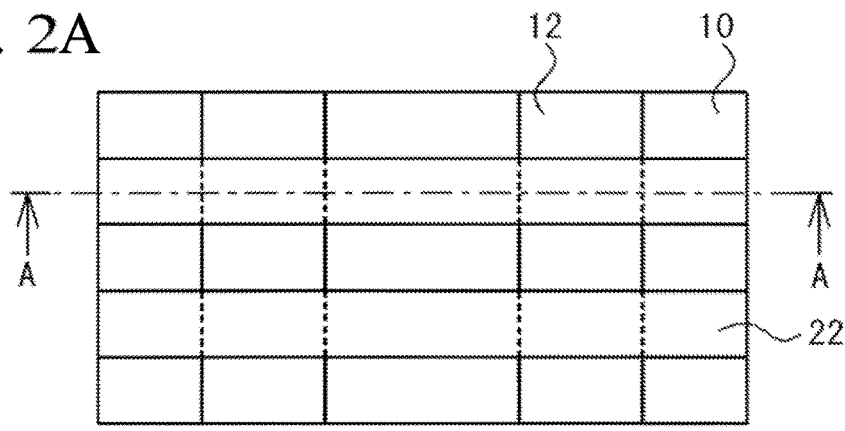
FIG. 2A is an upper plan view of a flash memory according to a first embodiment.
Figure 2B:
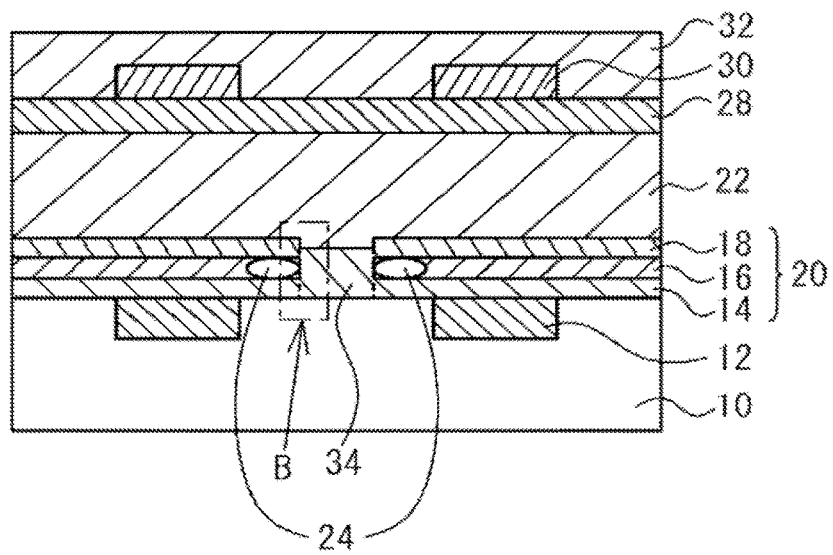
FIG. 2B is a cross-sectional view taken along A-A in FIG. 2A.
Figure 2C:
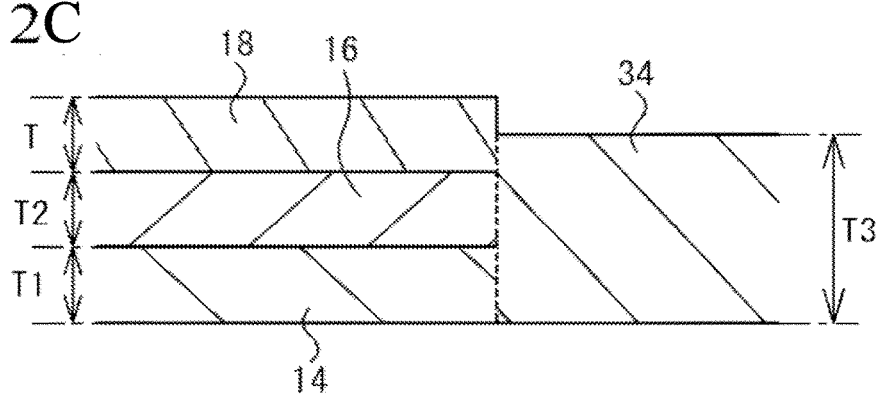
FIG. 2C is an enlarged view of area B in FIG. 2B.
Figure 3A:
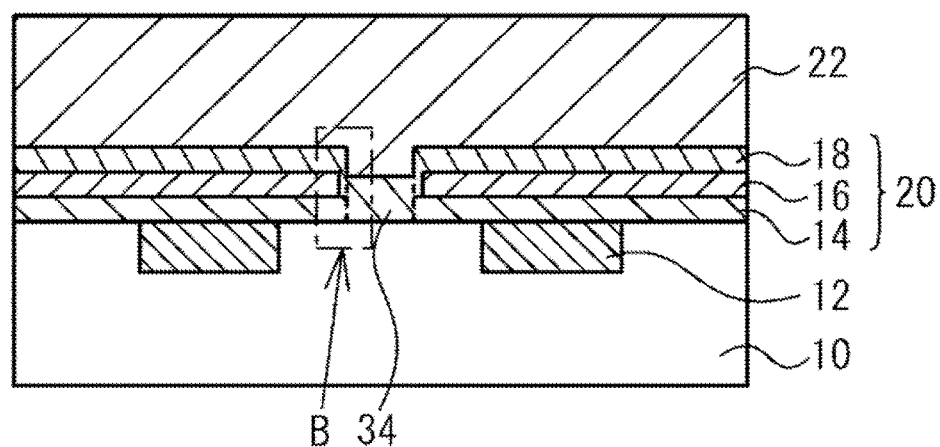
FIG. 3A is a cross-sectional view of a flash memory according to a comparative example.
Figure 3B:
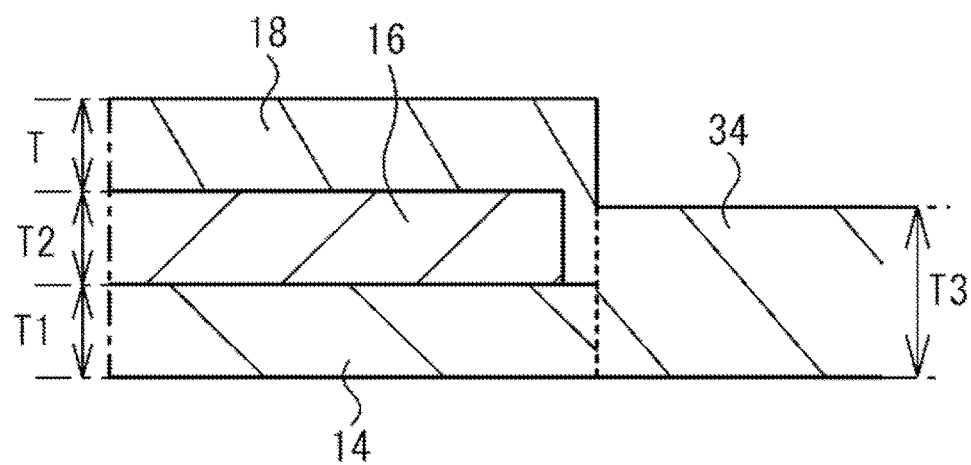
FIG. 3B is an enlarged view of area B in FIG. 3A.

FIG. 2A is an upper plan view of a flash memory according to a first embodiment, and FIG. 2B is a cross-sectional view taken along A-A in FIG. 2A. FIG. 2C is an enlarged view of an area B in FIG. 2B. Note that in FIG. 2A, illustration of an interlayer insulating film 28, a wiring layer 30, a protection film 32, an ONO film 20, and an oxide film 34 is omitted. FIG. 3A is a cross-sectional view of a flash memory according to a comparative example in the place corresponding to section A-A in FIG. 2A, and FIG. 3B is an enlarged view of area B in FIG. 3A. With reference to FIG. 2A, the flash memory according to the first embodiment is provided in its semiconductor substrate 10, which is a p-type silicon substrate (or a semiconductor substrate with a p-type silicon area), with a bit line 12, which is made of an n-type diffusion layer and serves as both the source and the drain, and a word line 22, which is made of, for example, a polysilicon film and serves also as a gate, intersecting each other.

With reference to FIG. 2B, the bit line 12 is provided in the semiconductor substrate 10. On the surface of the semiconductor substrate 10 above the bit line 12, a tunnel oxide film 14 which is a silicon oxide film, a trap layer 16 which is a silicon nitride film, and a top oxide film 18 which is a silicon oxide film are provided in this order to form the ONO film 20. The oxide film 34 which is a silicon oxide film is provided on the surface of the semiconductor substrate 10 in the middle between the bit lines 12. The oxide film 34 is in contact with the side face of the ONO film 20. By this arrangement, the trap layer 16 is separated in the middle between the bit lines 12. The word line 22 is provided so as to contact the ONO film 20. On the word line 22 is provided the interlayer insulating film 28, which is for example a silicon oxide film. On the interlayer insulating film 28, in the place above the bit line 12 is provided the wiring layer 30, which is for example of aluminum or copper. In a covering manner over the wiring layer 30 is provided the protection film 32, which is for example a silicon oxide film.

With reference to FIG. 2C, the tunnel oxide film 14, the trap layer 16, the top oxide film 18, and the oxide film 34 have thicknesses T1, T2, T, and T3, respectively. The thickness T3 of the oxide film 34 is the same as the equivalent oxide-film thickness (hereinafter EOT) of the ONO film 20. Note that the EOT refers to the film thickness of each material when the dielectric constant of each material is converted to that of a silicon oxide film. For example, since the dielectric constant of a silicon nitride film is approximately twice as much as that of a silicon oxide film, the EOT of the former is approximately ½ times as much as that of the latter. Therefore, the EOT of the ONO film 20 results in the sum of the thickness T1 of the tunnel oxide film 14, a ½ times the thickness T2 of the trap layer 16, and the thickness T of the top oxide film 18, that is, (T1+T2/2+T). Accordingly, the thickness T3 of the oxide film 34 is larger than the sum (T1+T) of the thickness T1 of the tunnel oxide film 14 and the thickness T of the top oxide film 18, and smaller than the thickness (T1+T2+T) of the ONO film 20.

With reference to FIG. 3A and FIG. 3B, in the flash memory according to the comparative example, the thickness T3 of the oxide film 34 is equal to or less than the sum (T1+T) of the thickness T1 of the tunnel oxide film 14 and the thickness T of the top oxide film 18. Since the other configuration is the same as that of the first embodiment and shown in FIG. 2A to FIG. 2C, its description is omitted. Note that in FIG. 3A, illustration of the interlayer insulating film 28, the wiring layer 30, and the protection film 32 is omitted (also omitted in second to fifth embodiments).

Next, using FIG. 4A to FIG. 5B, a manufacturing method of the flash memory according to the first embodiment is described. With reference to FIG. 4A, the bit line 12 which is an n-type diffusion layer is formed by injecting for example arsenic ions into the semiconductor substrate 10, which is a p-type silicon substrate (or a semiconductor substrate with a p-type silicon area), and then applying a heat treatment. With reference to FIG. 4B, the tunnel oxide film 14 made of a silicon oxide film is formed along the surface of the semiconductor substrate 10. On the tunnel oxide film 14 is formed the trap layer 16 made of a silicon nitride film. On the trap layer 16 is formed the top oxide film 18 made of a silicon oxide film. For example, the chemical vapor deposition (CVD) method or the thermal oxidation method can be used to form the tunnel oxide film 14 and the top oxide film 18. For example, the plasma CVD method can be used to form the trap layer 16. In this way is formed on the surface of the semiconductor substrate 10 the ONO film 20 made of the tunnel oxide film 14, the trap layer 16, and the top oxide film 18. With reference to FIG. 4C, using a photoresist formed into a prescribed pattern, the top oxide film 18 in the middle between the bit lines 12 is etched using the RIE (Reactive Ion Etching) method. At this time, etching is performed so that the top oxide film 18 remains to exist.

Figure 5A:
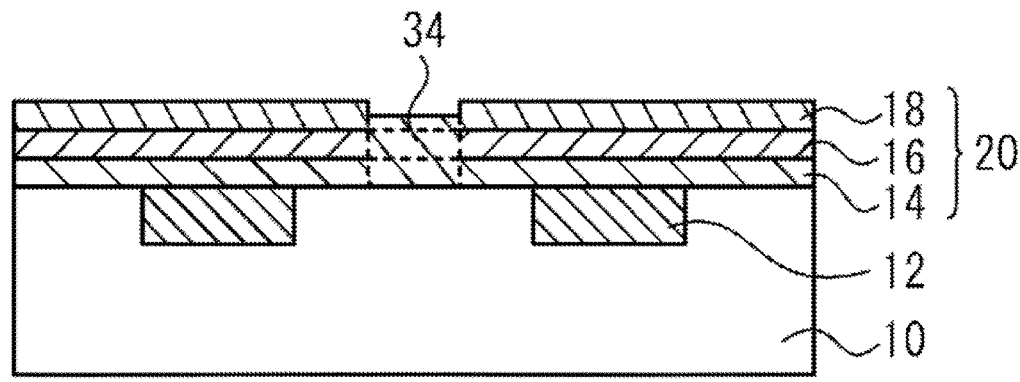
FIG. 5A and FIG. 5B are cross-sectional views (No. 2) showing a manufacturing process of a flash memory according to the first embodiment.
Figure 5B:
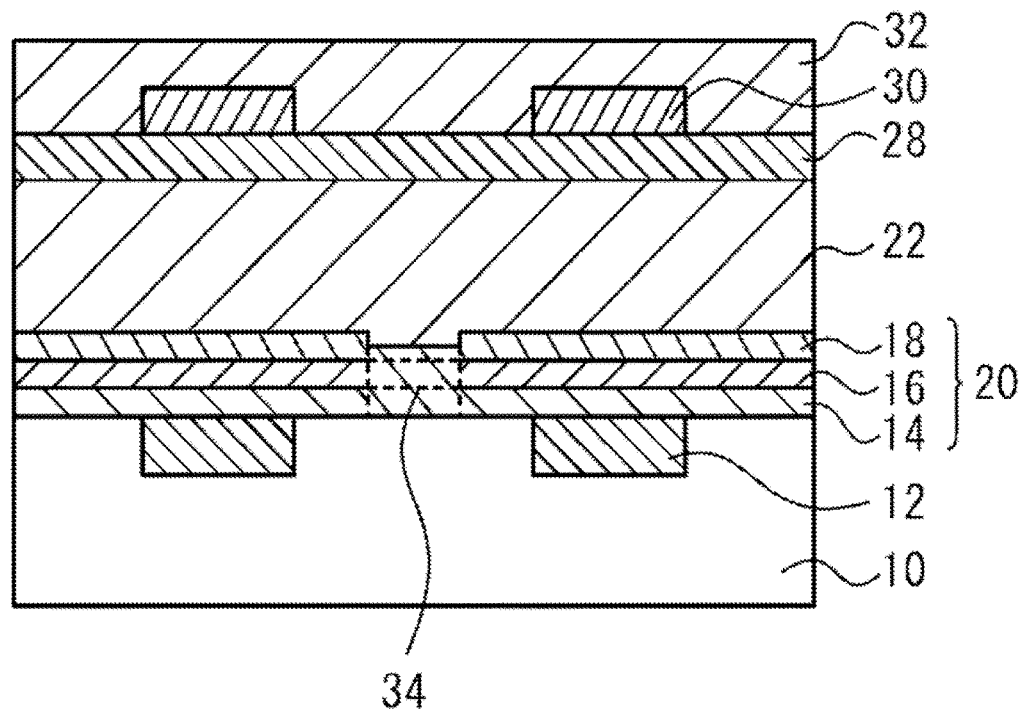

With reference to FIG. 5A, low-temperature radical oxidation is applied to the entire trap layer 16 under the etched portion of the top oxide film 18. In this way is formed the oxide film 34 made, in the middle between the bit lines 12, of the tunnel oxide film 14, the trap layer 16 which has become a silicon oxide film, and the top oxide film 18. Because of this arrangement, the trap layer 16 is separated in the middle between the bit lines 12. With reference to FIG. 5B, the word line 22 made of, for example, a polysilicon film is formed so as to contact the ONO film 20. Furthermore, the interlayer insulating film 28, the wiring layer 30, and the protection film 32 are formed. In this way, the flash memory according to the first embodiment is completed.

Next, using FIG. 6A to FIG. 6C, a manufacturing method of the flash memory according to the comparative example is described. Since the process to form the bit line 12 is the same as that of the first embodiment and shown in FIG. 4A, its description is omitted. With reference to FIG. 6A, on the surface of the semiconductor substrate 10, the tunnel oxide film 14 made of a silicon oxide film and the trap layer 16 made of a silicon nitride film are formed in this order. With reference to FIG. 6B, using a photoresist formed into a prescribed pattern, the trap layer 16 in the middle between the bit lines 12 is etched using the RIE method. With reference to FIG. 6C, the top oxide film 18 made of a silicon oxide film is formed above the tunnel oxide film 14 and the trap layer 16. In this way is formed on the surface of the semiconductor substrate 10 above the bit line 12 the ONO film 20 made of the tunnel oxide film 14, the trap layer 16, and the top oxide film 18. In addition, on the surface of the semiconductor substrate 10 in the middle between bit lines 12 is formed the oxide film 34 made of the tunnel oxide film 14 and the top oxide film 18. The word line 22 is formed so as to contact the ONO film 20. Furthermore, the interlayer insulating film 28, the wiring layer 30, and the protection film 32 (illustration is omitted) are formed. In this way, the flash memory according to the comparative example is completed.

According to the first embodiment, on the surface of the semiconductor substrate 10 in the middle between bit lines 12 is provided the oxide film 34, as shown in FIG. 2B. By this arrangement, the trap layer 16 is separated in the middle between the bit lines 12, whereby interference of electrons accumulated in two charge storage areas 24 can be suppressed even when memory cells are miniaturized and the length of a channel 26 is reduced. Therefore, distinctness of data reading can be improved when reading out the data stored in the two charge storage areas 24.

Moreover, according to the first embodiment, the trap layer 16 does not exist in the middle between the bit lines 12, as shown in FIG. 2B. Because of this arrangement, the first embodiment does not cause excessive erasing, which has been a problem in data erasing methods using the Fowler-Nordheim (F-N) tunnel effect in related-art examples. Therefore, the F-N tunnel effect can be used as a data erasing method in the first embodiment. The data erasing method using the F-N tunnel effect refers to, for example, a method in which the word line 22 serving also as a gate is grounded, and a high electric field is applied between the word line 22 and the semiconductor substrate 10; thus, electrons are removed from each charge storage area 24. By using the F-N tunnel effect, electrons can be erased collectively from two charge storage areas 24.

As shown in FIG. 6C, the comparative example forms the oxide film 34 made of the tunnel oxide film 14 and the top oxide film 18 by forming the top oxide film 18 above the tunnel oxide film 14. In the comparative example, the thickness T3 of the oxide film 34 is equal to or less (due to overetching of the trap layer 16) than the sum (T1+T) of the thickness T1 of the tunnel oxide film 14 and the thickness T of the top oxide film 18. The EOT of the ONO film 20 on the bit line 12 is the sum (T1+T2/2+T) of the thickness T1 of the tunnel oxide film 14, an approximately ½ times the thickness T2 of the trap layer 16, and the thickness T of the top oxide film 18. This means that, in the comparative example, it is impossible to make the thickness T3 of the oxide film 34 and the EOT of the ONO film 20 equal to each other.

Figure 7:
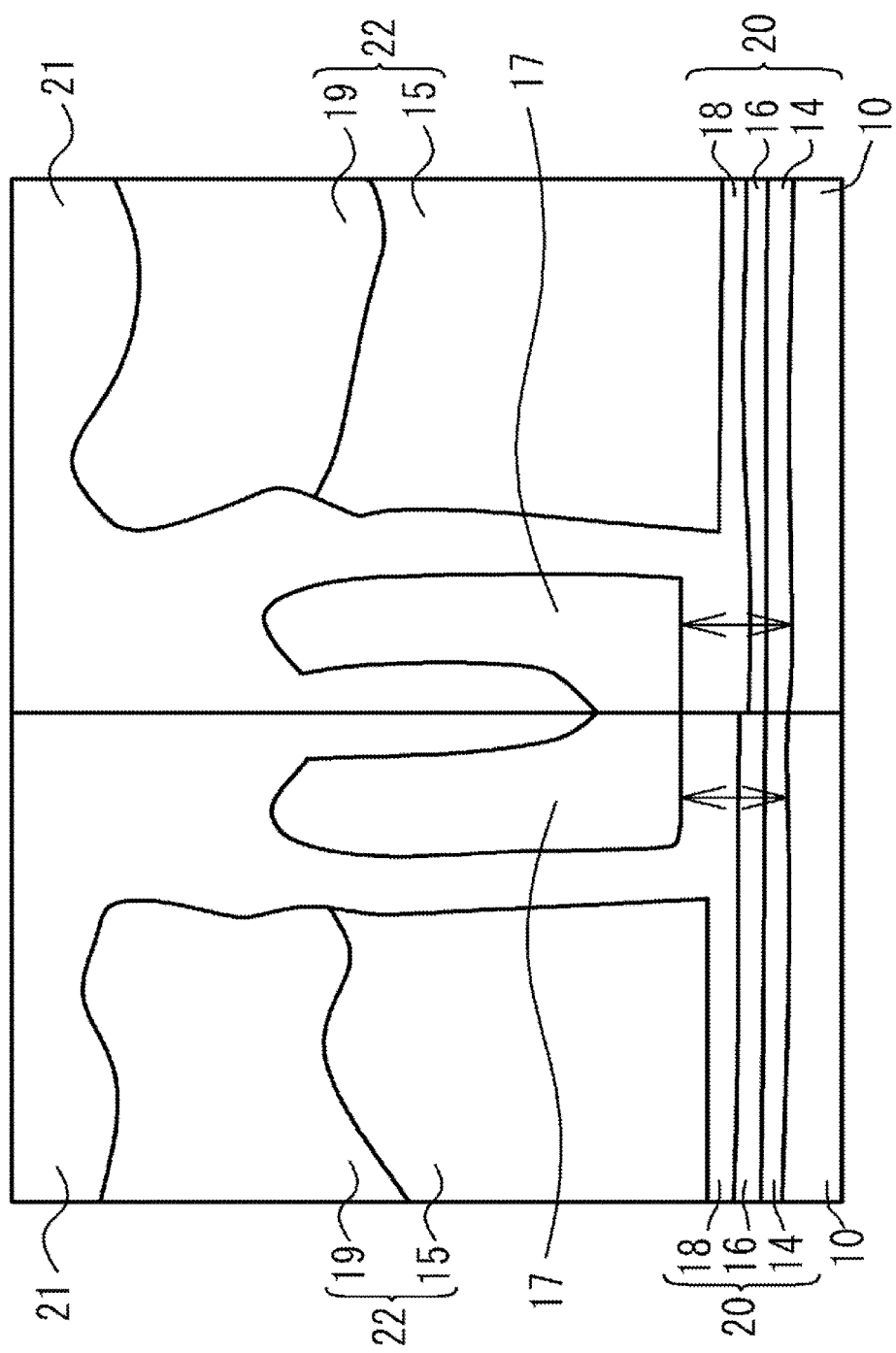
FIG. 7 is a pattern diagram showing the change in film thickness between before and after low-temperature radical oxidation when the low-temperature radical oxidation is applied through an oxide film.
Figure 8:
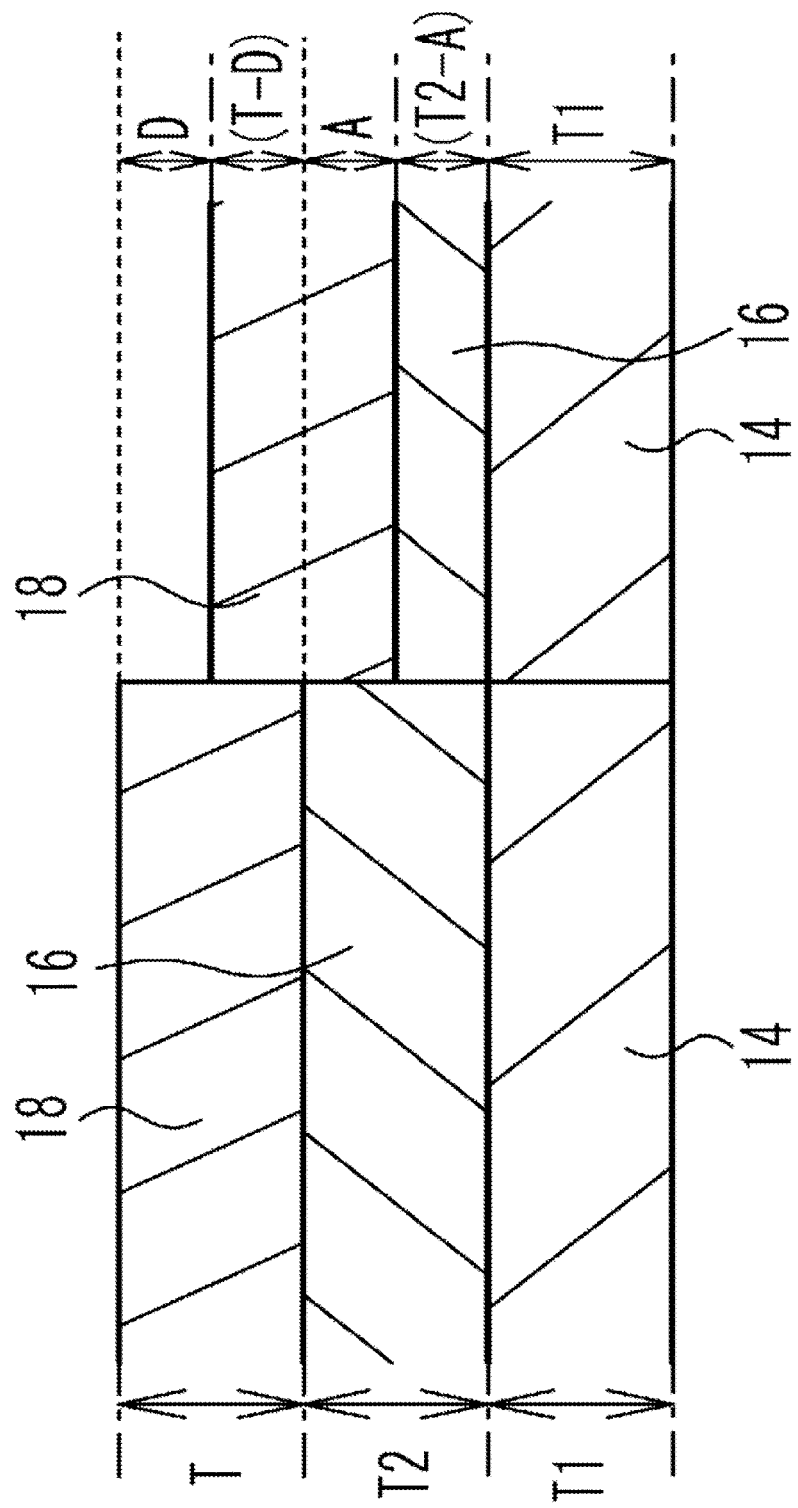
FIG. 8 is a cross-sectional view for describing the equivalent oxide-film thickness (EOT) after low-temperature radical oxidation.

On the other hand, as shown in FIG. 5A, the first embodiment forms the oxide film 34 made of the tunnel oxide film 14, the trap layer 16 which has become a silicon oxide film, and the top oxide film 18, by applying low-temperature radical oxidation to the entire trap layer 16 under the etched portion of the top oxide film 18. In addition, the top oxide film 18 in the middle between the bit lines 12 is etched so that the top oxide film 18 remains to exist. When the low-temperature radical oxidation is applied to the trap layer 16 under the etched portion of the top oxide film 18 while the top oxide film 18 is remaining, the total film thickness does not change between before and after the low-temperature radical oxidation. FIG. 7 shows the result of an experiment conducted to confirm this. FIG. 7 is a pattern diagram of a cross-sectional SEM photograph; the left side of FIG. 7 shows a diagram before the low-temperature radical oxidation is applied to the ONO film 20, and the right side of FIG. 7 shows a diagram after the low-temperature radical oxidation is applied to a thickness of 9 nm of the trap layer 16. With reference to FIG. 7, on the semiconductor substrate 10 is provided the ONO film 20. On the ONO film 20 are provided a polysilicon film 15 and a silicon nitride film 17. On the polysilicon film 15 is provided a silicide layer 19 by which the word line 22 is formed. An insulating film 21 is provided in a covering manner over the word line 22 and the silicon nitride film 17. From FIG. 7, it can be confirmed that the thickness of the ONO film 20 does not change between before and after the low-temperature radical oxidation. Therefore, as shown in FIG. 8, in case that an etching is performed so that the top oxide film 18 remains to exist and low-temperature radical oxidation is applied to the trap layer 16 through the top oxide film 18, assuming the amount of etching of the top oxide film 18 as D and the amount of oxidation of the trap layer 16 as A, the EOT is given as $T1+(T2-A)/2+A+(T-D)$. Since the EOT of the tunnel oxide film 14, the trap layer 16, and the top oxide film 18 is given as $T1+T2/2+T$, the EOTs can be equal to each other by satisfying $D=A/2$. In the first embodiment, A is equal to T2 because the trap layer 16 is entirely oxidized. Accordingly, it is enough to satisfy $D=T2/2$.

Figure 9A:
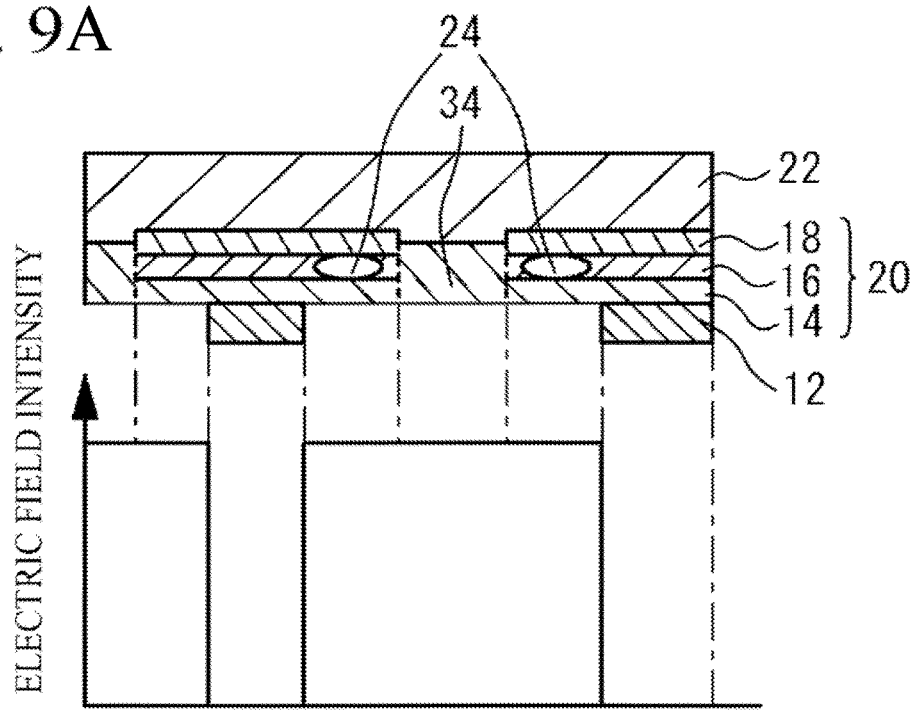
Figure 9B:
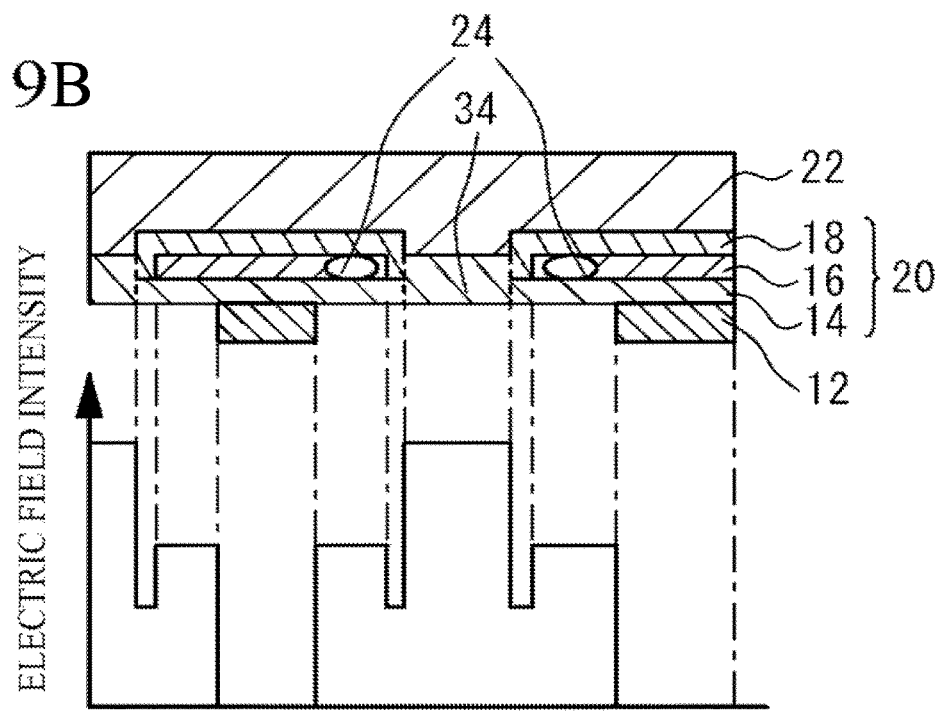

FIG. 9A shows the electric field intensity distribution of the flash memory in data erase using the F-N tunnel effect according to the first embodiment, and FIG. 9B shows a corresponding distribution according to the comparative example. With reference to FIG. 9B, in case of the comparative example in which the thickness T3 of the oxide film 34 is less than the EOT of the ONO film 20, most part of the electric current caused by the F-N tunnel effect flows through the oxide film 34. Consequently, the electric field intensity applied to the oxide film 34 becomes large, and an electric field of sufficient intensity cannot be applied to the trap layer 16. Because of this arrangement, it becomes difficult to efficiently remove electrons from the charge storage area 24 of the trap layer 16. On the other hand, as shown in FIG. 9A, in case of the first embodiment in which the thickness T3 of the oxide film 34 is equal to the EOT of the ONO film 20, because the electric current caused by the F-N tunnel effect flows uniformly through the oxide film 34 and the trap layer 16, the electric field intensity distribution is also uniform in the oxide film 34 and the trap layer 16. Therefore, an electric field of sufficient intensity can be applied to the trap layer 16, and it becomes possible to efficiently remove electrons from the charge storage area 24.

As described above, according to the first embodiment, by providing the oxide film 34 in the middle between the bit lines 12 and separating the trap layer 16 in the middle between the bit lines 12, distinctness of reading the data stored in two charge storage areas 24 is improved, and it becomes possible to erase data using the F-N tunnel effect. In addition, by making the thickness T3 of the oxide film 34 and the EOT of the ONO film 20 equal to each other, the electric field intensity can be uniformly applied to the oxide film 34 and the trap layer 16. Because of this arrangement, electrons can be efficiently removed from the charge storage area 24 so that data erasing characteristics can be improved. Therefore, high integration and miniaturization of memory cells become possible.

Figure 10:
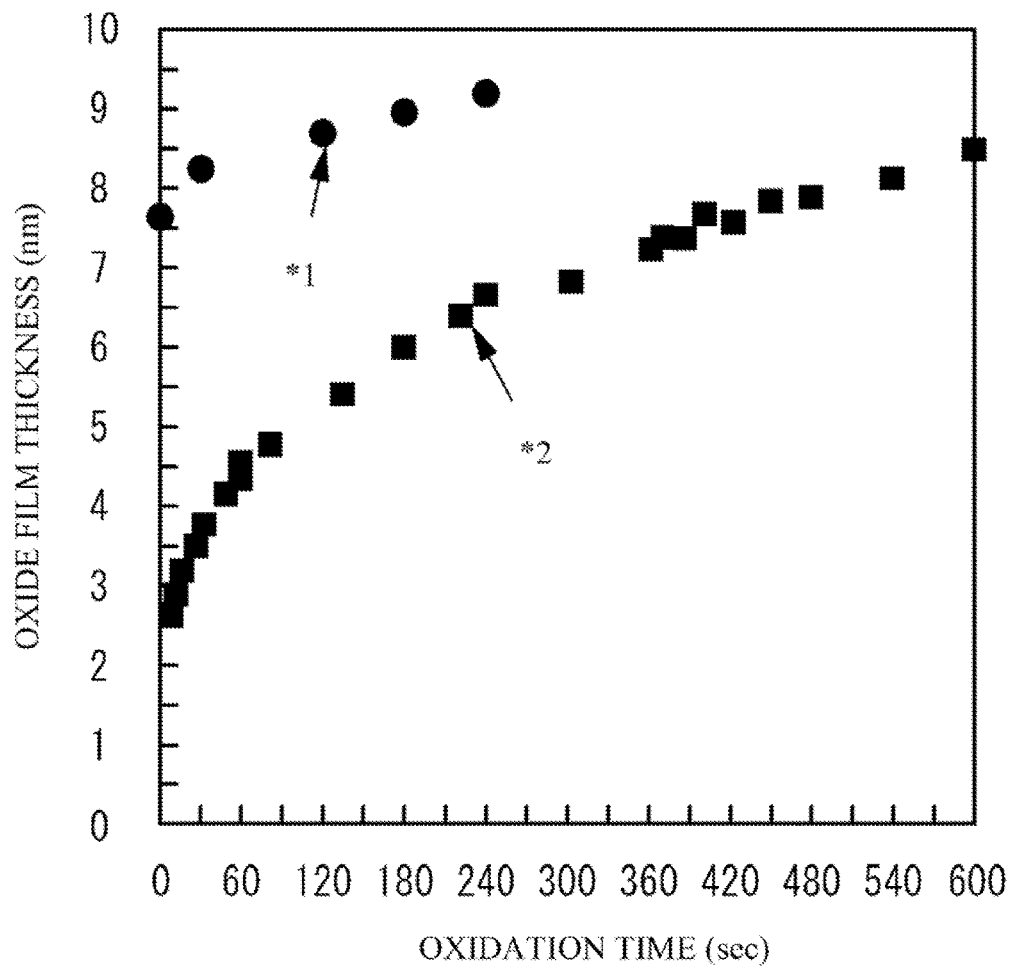
FIG. 10 is a graph for describing the rate of oxidation in low-temperature radical oxidation.

In case of oxidation of the trap layer 16 by low-temperature radical oxidation through the top oxide film 18 as shown in FIG. 5A, the rate of oxidation can be controlled by the film thickness of the top oxide film 18. FIG. 10 shows the result of an experiment conducted to confirm this. With reference to FIG. 10, the horizontal axis of the graph represents oxidation time, and the vertical axis represents the oxide film thickness; square plots show the rates of oxidation in case of direct low-temperature radical oxidation on an Si substrate, and circular plots show the rates of oxidation in case that the low-temperature radical oxidation is applied through a thermal oxide film with a thickness of 7.6 nm formed on an Si substrate. From FIG. 10, it is found that the thicker the oxide film is, the slower the oxidation becomes. In the low-temperature radical oxidation, the number of oxidation radicals that can pass through the oxide film depends on the thickness of the oxide film. Because of this principle, the thicker the oxide film becomes, the smaller the number of oxidation radicals that can pass through the oxide film becomes, and thus the slower the oxidation becomes. As a result, the rate of oxidation can be controlled by controlling the thickness of the oxide film. Therefore, in case of low-temperature radical oxidation of the trap layer 16 through the top oxide film 18, the trap layer 16 can be selectively oxidized through the low-temperature radical oxidation by controlling the thickness of the top oxide film 18.

Moreover, according to the first embodiment, as shown in FIG. 5A, the trap layer 16 is entirely oxidized by low-temperature radical oxidation to form the oxide film 34, which is made of the tunnel oxide film 14, the trap layer 16 which has become a silicon oxide film, and the top oxide film 18. Because of this arrangement, film thickness control and uniformity of the oxide film 34 can be improved compared with other cases like the comparative example in which the trap layer 16 is etched to form the oxide film 34 made of the tunnel oxide film 14 and the top oxide film 18. In addition, whereas the trap layer 16 and the tunnel oxide film 14 can be damaged by etching in the comparative example, they are not damaged in the first embodiment because etching is not applied. Furthermore, whereas in the comparative example burying of the word line 22 is difficult because of severe surface irregularity caused by a large difference in thickness between the oxide film 34 and the ONO film 20, in the first embodiment the word line 22 can be buried without problems because surface irregularity is small.

In the first embodiment, although there has been shown an example in which the thickness T3 of the oxide film 34 and the EOT of the ONO film 20 are equal to each other, embodiments are not limited to this example. As long as electrons can be efficiently removed from the charge storage area 24 in data erase using the F-N tunnel effect, the thickness T3 of the oxide film 34 and the EOT of the ONO film 20 may be different from each other.

Moreover, in the first embodiment, as shown in FIG. 4C, although the top oxide film 18 is etched so that the top oxide film 18 remains to exist, not limited to this, the top oxide film 18 may be etched entirely. In this case, because the trap layer 16 is exposed, when the trap layer 16 is oxidized by low-temperature radical oxidation, the oxide film thickness after oxidation becomes 3/2 times the amount of oxidation of the trap layer 16. Therefore, the thickness T3 of the oxide film 34 becomes the sum (T1+T2.times.3/2) of the thickness T1 of the tunnel oxide film 14 and a 3/2 times the amount of oxidation A of the trap layer 16 (A=T2 in the first embodiment because the trap layer 16 is entirely oxidized). In addition, because the EOT of the ONO film 20 is given as T1+T2/2+T, the thickness T3 of the oxide film 34 and the EOT of the ONO film 20 can be equal to each other by satisfying T=T2=A.

Moreover, in the first embodiment, although there has been shown an example in which the trap layer 16 is oxidized through low-temperature radical oxidation, not limited to this, other oxidation methods may be used. It is preferable to use the low-temperature radical oxidation because it can provide high oxidization rates, can oxidize the trap layer 16 through the top oxide film 18, and can also selectively oxidize the trap layer 16 by controlling the thickness of the top oxide film 18.

Figure 11:
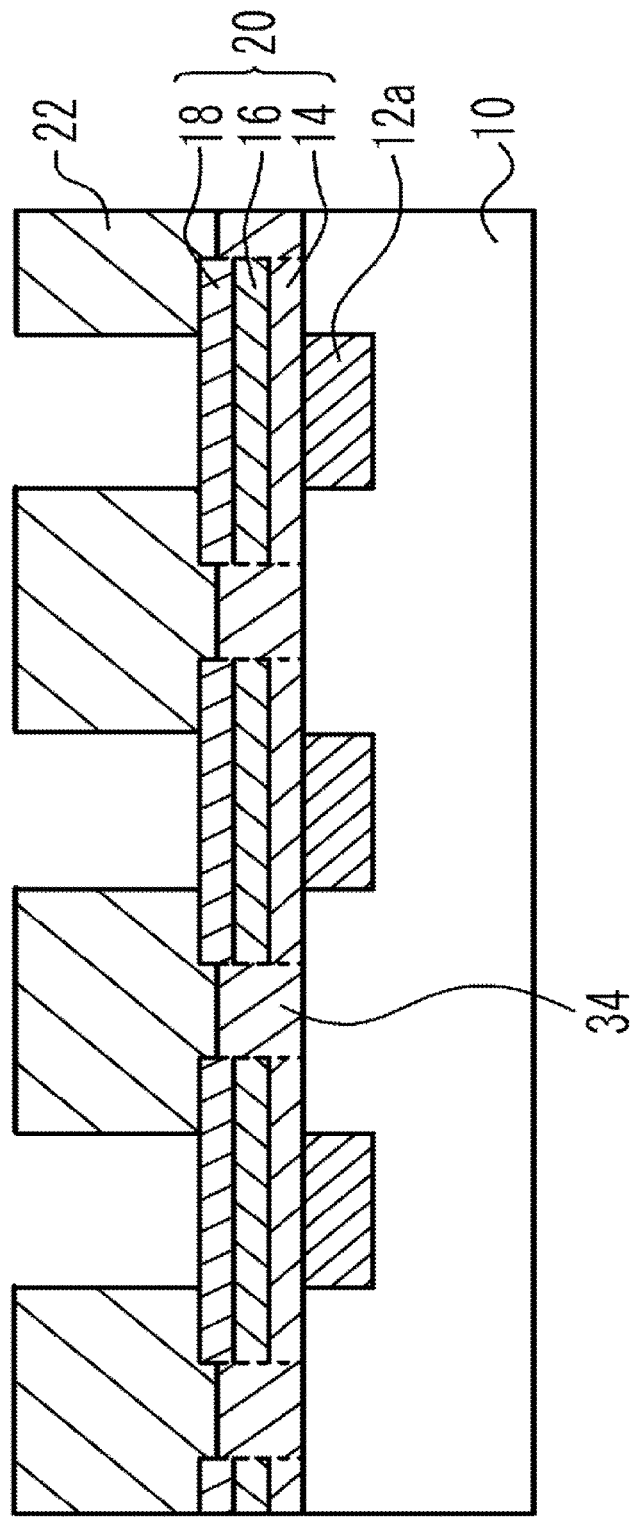
FIG. 11 is a cross-sectional view of a NAND-structured flash memory according to the first embodiment.

Moreover, in the first embodiment, although there has been shown an example of a semiconductor device having a NOR structure, the same effect as that of the NOR-structured semiconductor device can also be obtained by applying the present invention to a semiconductor device having a NAND structure as shown in FIG. 11. As shown in FIG. 11, the NAND-structured semiconductor device is provided with a source/drain line 12a in the semiconductor substrate 10. The word line 22 is divided at the location above the source/drain line 12a. Since the other configuration is the same as that of the first embodiment and shown in FIG. 2A to FIG. 2C, its description is omitted.

Figure 12:
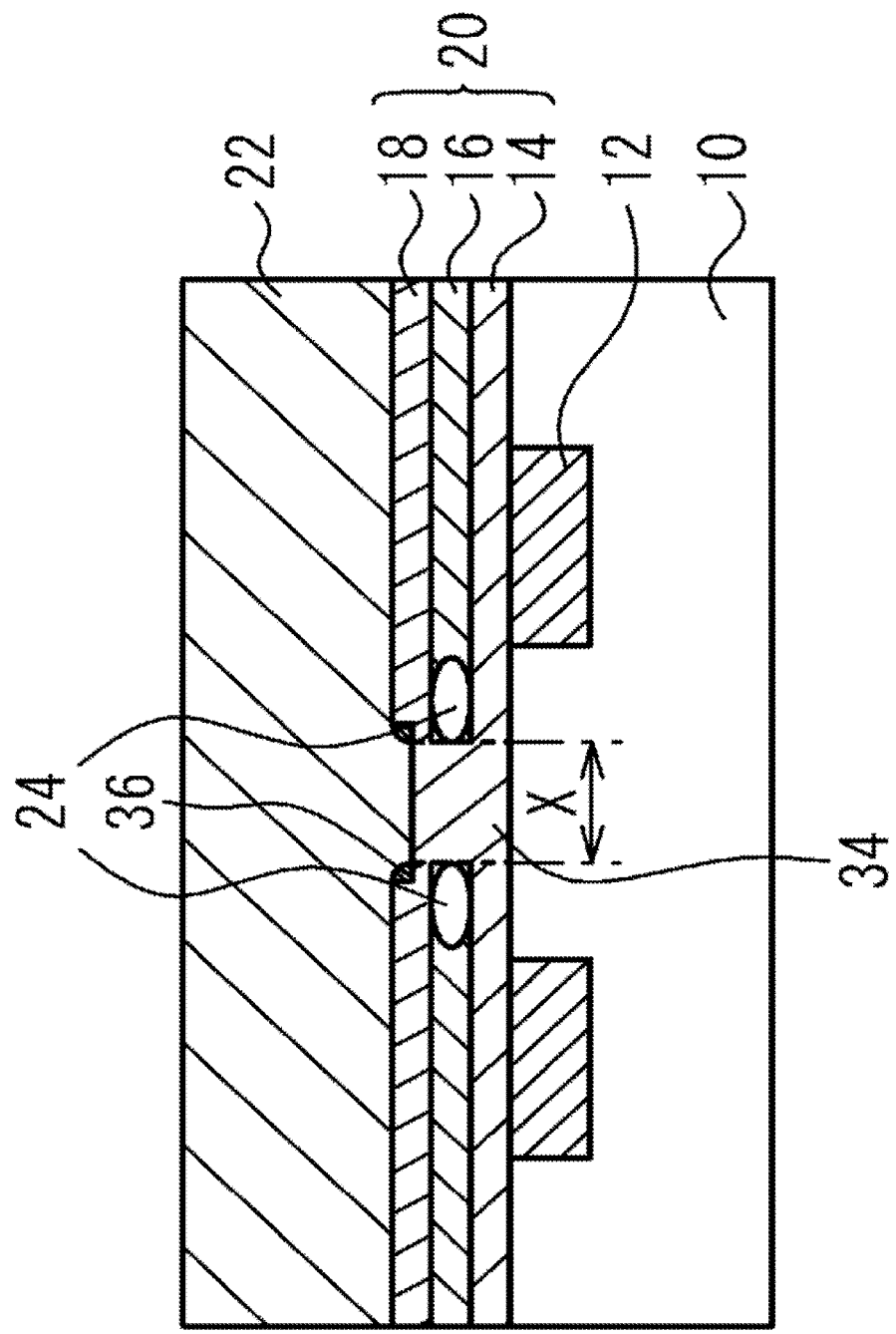
FIG. 12 is a cross-sectional view of a flash memory according to a modified example of the first embodiment.

FIG. 12 is a cross-sectional view of a flash memory according to a modified example of the first embodiment in the place corresponding to section A-A in FIG. 2A. With reference to FIG. 12, a second sidewall layer 36 is provided on the sidewall of the top oxide film 18, and the width X of the oxide film 34 provided on the surface of the semiconductor substrate 10 in the middle between the bit lines 12 is smaller than that of the first embodiment. Since the other configuration is the same as that of the first embodiment and shown in FIG. 2A to FIG. 2C, its description is omitted.

Figure 13A:
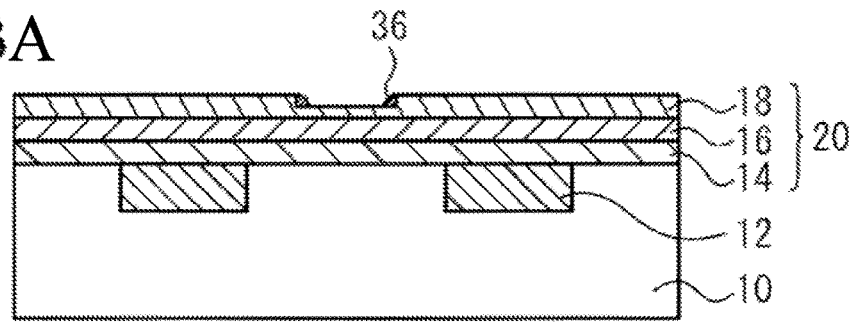
FIG. 13A to FIG. 13C are cross-sectional views showing a manufacturing method of a flash memory according to a modified example of the first embodiment.
Figure 13B:
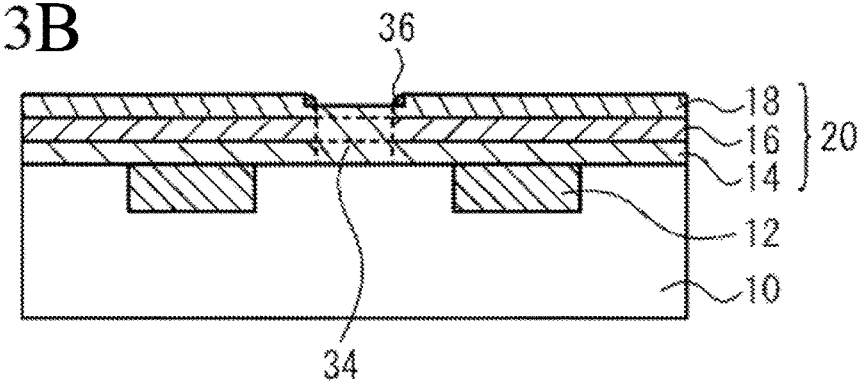
Figure 13C:
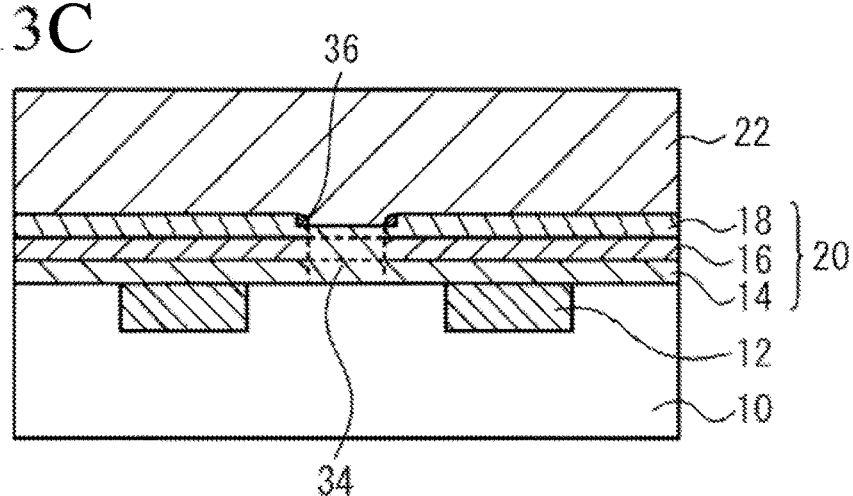

Next, using FIG. 13A to FIG. 13C, a manufacturing method of the flash memory according to the modified example of the first embodiment is described. Since the processes to form the bit line 12 in the semiconductor substrate 10, to form the ONO film 20 on the semiconductor substrate 10, and to etch the top oxide film 18 in the middle between the bit lines 12 are the same as those of the first embodiment and shown in FIG. 4A to FIG. 4C, their description is omitted. With reference to FIG. 13A, a silicon oxide film is formed on the top oxide film 18. The silicon oxide film is etched using for example the RIE method to form the second sidewall layer 36 on the sidewall of the top oxide film 18. With reference to FIG. 13B, using the second sidewall layer 36 as a mask, low-temperature radical oxidation is applied to the trap layer 16 under the etched portion of the top oxide film 18 to form the oxide film 34, which is made of the tunnel oxide film 14, the trap layer 16 which has become a silicon oxide film, and the top oxide film 18. With reference to FIG. 13C, the word line 22 is formed so as to contact the ONO film 20. Furthermore, the interlayer insulating film 28, the wiring layer 30, and the protection film 32 (illustration is omitted) are formed. In this way, the flash memory according to the modified example of the first embodiment is completed.

According to the modified example of the first embodiment, as shown in FIG. 13B, using as a mask the second sidewall layer 36 formed on the sidewall of the top oxide film 18, low-temperature radical oxidation is applied to the trap layer 16 under the etched portion of the top oxide film 18 to form the oxide film 34, which is made of the tunnel oxide film 14, the trap layer 16 which has become a silicon oxide film, and the top oxide film 18. Because of this arrangement, the width X of the oxide film 34 is smaller than that of the first embodiment. In other words, the area of the trap layer 16 above the bit line 12 is larger than that of the first embodiment. Therefore, even when memory cells are miniaturized and the distance between the bit lines 12 is reduced, the charge storage area 24 can be increased compared with the first embodiment, and consequently more electrons can be stored in the charge storage area 24.

Second Embodiment

Figure 14:
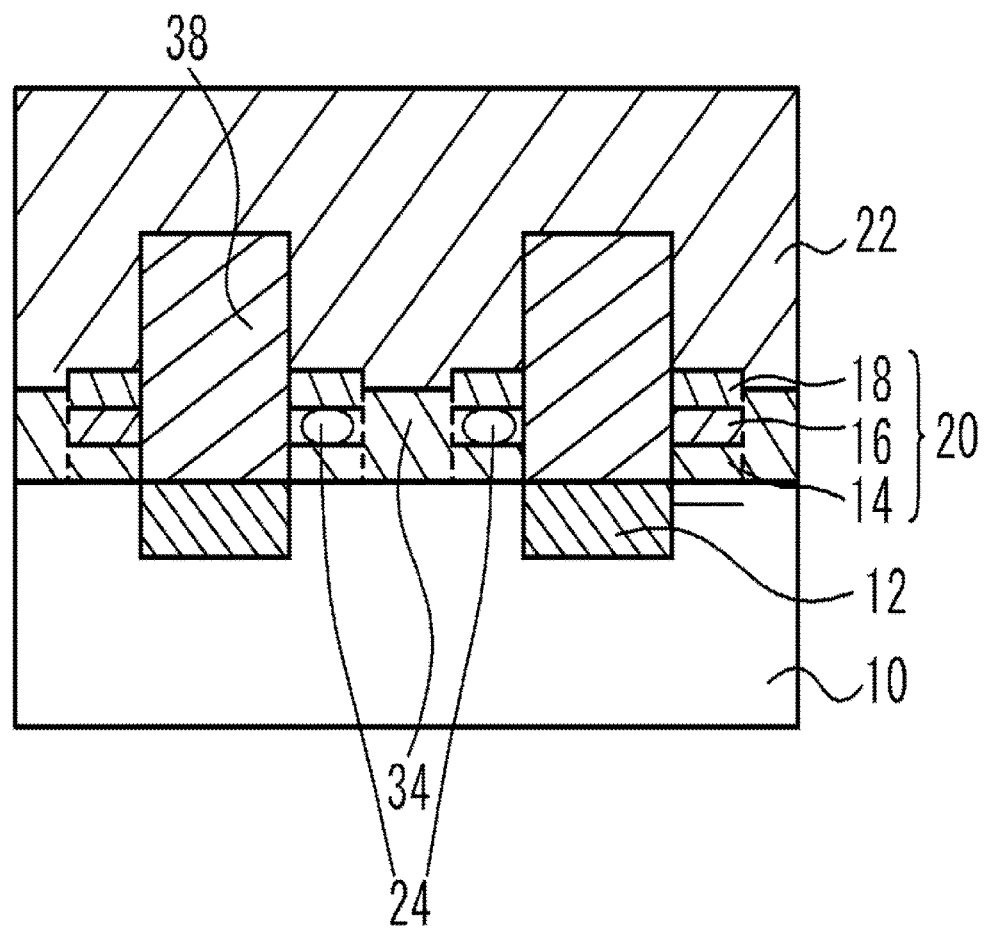
FIG. 14 is a cross-sectional view of a flash memory according to a second embodiment.

FIG. 14 is a cross-sectional view of a flash memory according to a second embodiment in the place corresponding to section A-A in FIG. 2A. With reference to FIG. 14, on the bit line 12 is provided an insulating film 38 that penetrates the ONO film 20 and has a film thickness larger than that of the ONO film 20. The word line 22 is provided so as to cover the insulating film 38 and to contact the ONO film 20. Since the other configuration is the same as that of the first embodiment and shown in FIG. 2A to FIG. 2C, its description is omitted.

Figure 15A:
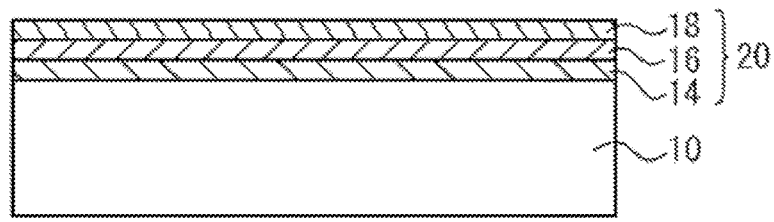
FIG. 15A to FIG. 15D are cross-sectional views (No. 1) showing a manufacturing process of a flash memory according to the second embodiment.

Next, using FIG. 15A to FIG. 16C, a manufacturing method of the flash memory according to the second embodiment is described. With reference to FIG. 15A, on the semiconductor substrate 10 are sequentially formed the tunnel oxide film 14 made of a silicon oxide film, the trap layer 16 made of a silicon nitride film, and the top oxide film 18 made of a silicon oxide film. In this way is formed the ONO film 20 on the semiconductor substrate 10. With reference to FIG. 15B, on the ONO film 20 is formed a mask layer 40 made of a polysilicon film using for example the CVD method. Using a photoresist formed into a prescribed pattern, a hole portion 41 is formed by etching the mask layer 40 and the ONO film 20 using the RIE method. Using the mask layer 40 as a mask, the bit line 12 is formed in the semiconductor substrate 10. With reference to FIG. 15C, in the hole portion 41 above the bit line 12, there is formed the insulating film 38 that penetrates the ONO film 20 and is thicker than the ONO film 20, using for example high-density plasma CVD. In short, the insulating film 38 is formed defined by the mask layer 40. After that, the mask layer 40 and the insulating film 38 are polished using the chemical mechanical polishing (CMP) method. With reference to FIG. 15D, after etching the mask layer 40 using the RIE method, a silicon nitride film is formed on the ONO film 20 to cover the insulating film 38. Using for example the RIE method, the silicon nitride film is etched to form on the sidewall of the insulating film 38 a first sidewall layer 42, which is made of the silicon nitride film.

Figure 16A:
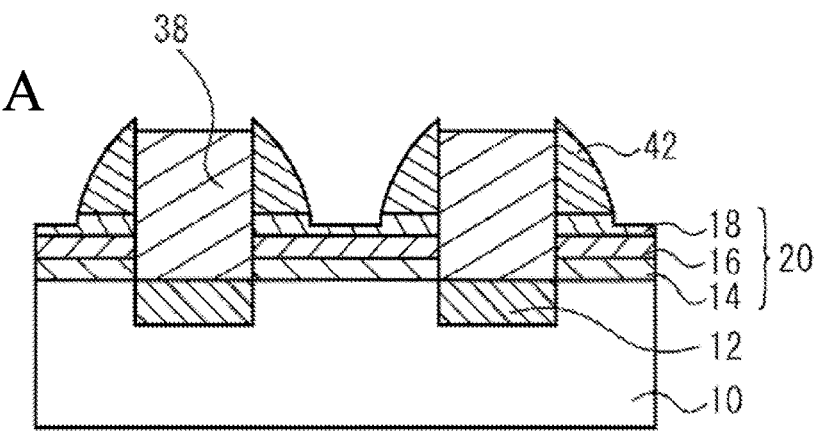
FIG. 16A to FIG. 16C are cross-sectional views (No. 2) showing a manufacturing process of a flash memory according to the second embodiment.
Figure 16B:
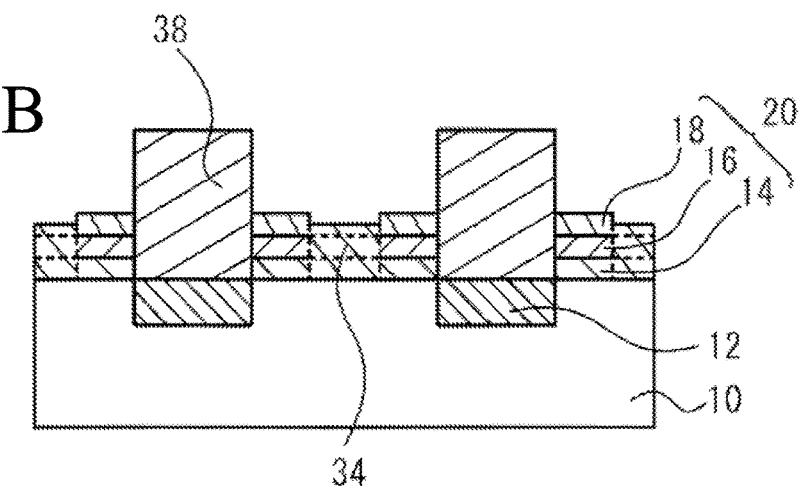
Figure 16C:
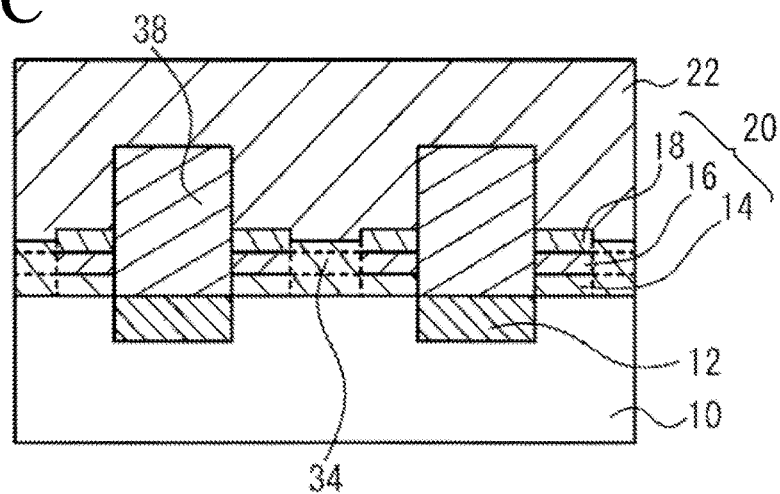

With reference to FIG. 16A, using the first sidewall layer 42 as a mask, the top oxide film 18 is etched using for example the RIE method. At this time, etching is performed so that the top oxide film 18 remains to exist. With reference to FIG. 16B, after removing the first sidewall layer 42 by wet etching using a phosphoric acid solution, low-temperature radical oxidation is applied to the entire trap layer 16 under the etched portion of the top oxide film 18. In this way is formed the oxide film 34 made, in the middle between the bit lines 12, of the tunnel oxide film 14, the trap layer 16 which has become a silicon oxide film, and the top oxide film 18. This means that the trap layer 16 is separated between the bit lines 12. With reference to FIG. 16C, the word line 22 is formed so as to cover the insulating film 38 and contact the ONO film 20. Furthermore, the interlayer insulating film 28, the wiring layer 30, and the protection film 32 (illustration is omitted) are formed. In this way, the flash memory according to the second embodiment is completed.

Figure 15B:
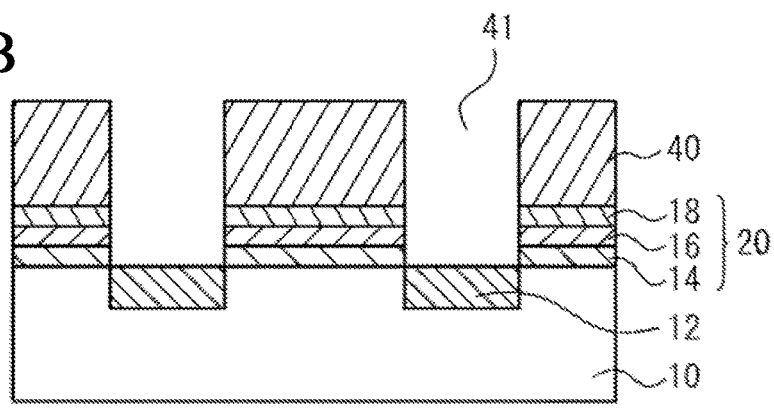
Figure 15C:
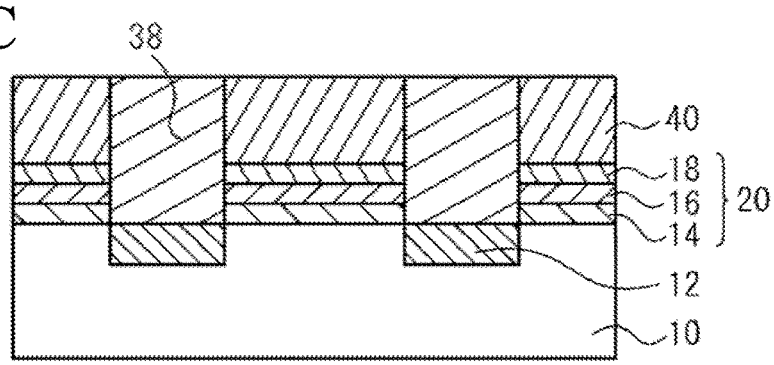

According to the second embodiment, the bit line 12 is formed in the semiconductor substrate 10 using the mask layer 40 as a mask as shown in FIG. 15B, and the insulating film 38 defined by the mask layer 40 is formed on the bit line 12 as shown in FIG. 15C. In addition, as shown in FIG. 16A, using as a mask the first sidewall layer 42 formed on the sidewall of the insulating film 38, the top oxide film 18 is etched. Because of this method, the etching of the top oxide film 18 can be self-aligned to the bit line 12. Accordingly, as shown in FIG. 16B, the low-temperature radical oxidation can oxidize the trap layer 16 which is self-aligned to the bit line 12. As a result, according to the second embodiment, because the oxide film 34 can be self-aligned to the bit line 12, the charge storage area 24 of an appropriate size can be formed even when memory cells are further miniaturized and the distance between the bit lines 12 becomes smaller.

In the second embodiment, similarly to the modified example of the first embodiment, the width of the oxide film 34 can be reduced by applying low-temperature radical oxidation to the trap layer 16 using the second sidewall layer 36 as a mask.

Figure 17:
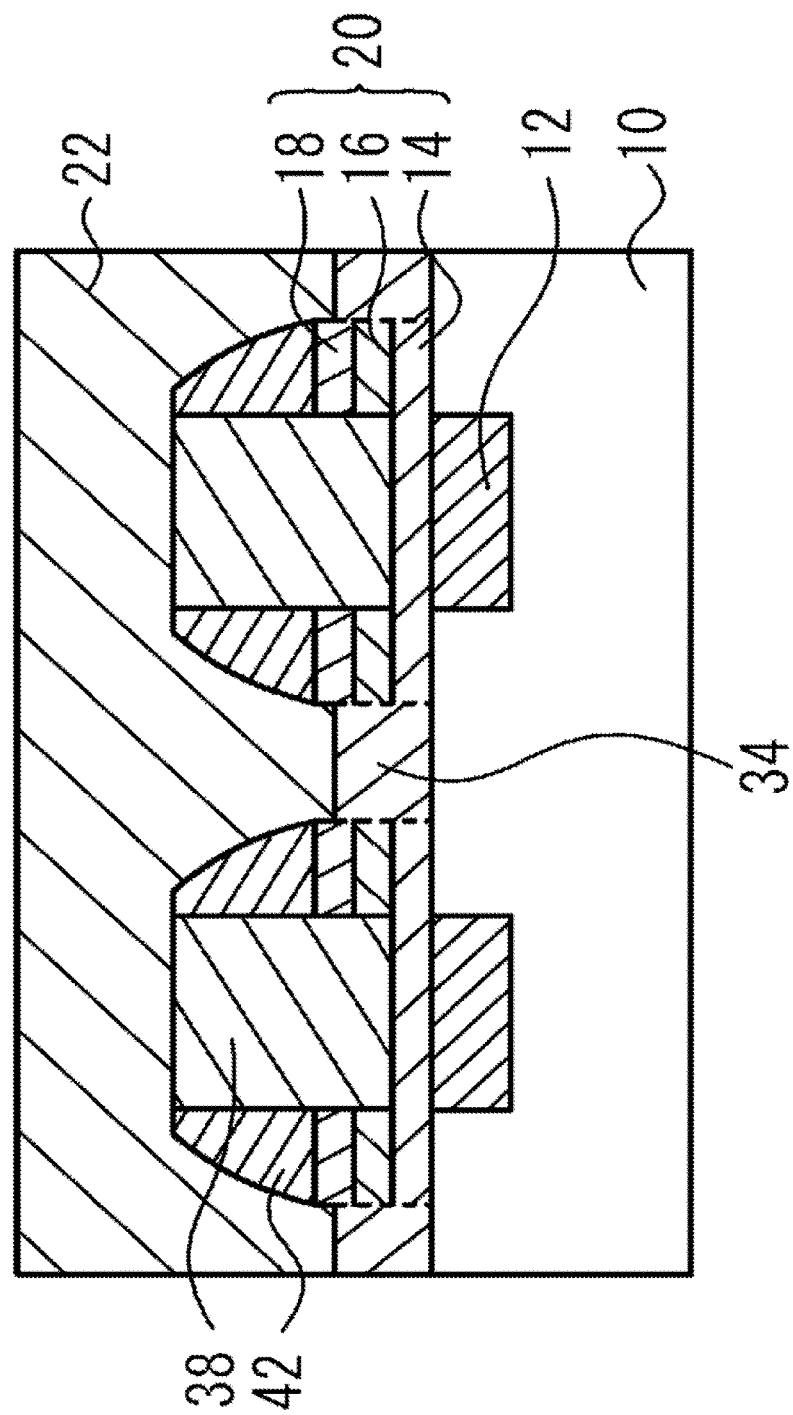
FIG. 17 is a cross-sectional view of a flash memory according to a modified example of the second embodiment.

FIG. 17 is a cross-sectional view of a flash memory according to a modified example of the second embodiment in the place corresponding to section A-A in FIG. 2A. With reference to FIG. 17, above the bit line 12 is provided the insulating film 38 penetrating the trap layer 16 and the top oxide film 18. On the sidewall of the insulating film 38 is provided the first sidewall layer 42. Since the other configuration is the same as that of the second embodiment and shown in FIG. 14, its description is omitted.

Figure 18A:
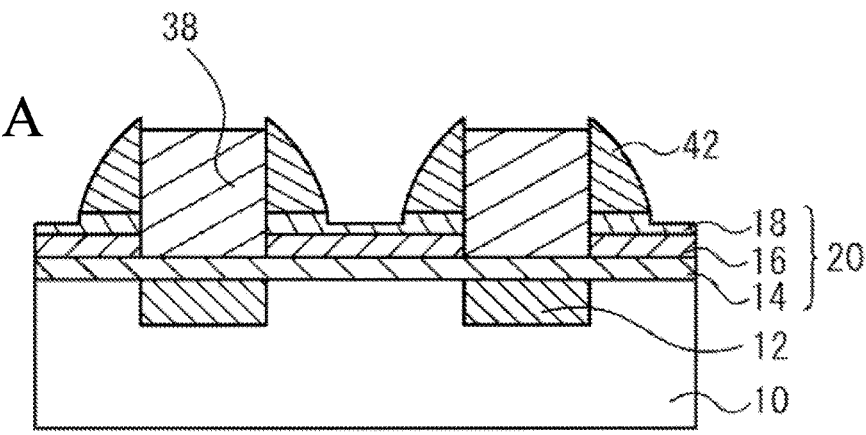
FIG. 18A to FIG. 18C are cross-sectional views showing a manufacturing method of a flash memory according to a modified example of the second embodiment.
Figure 18B:
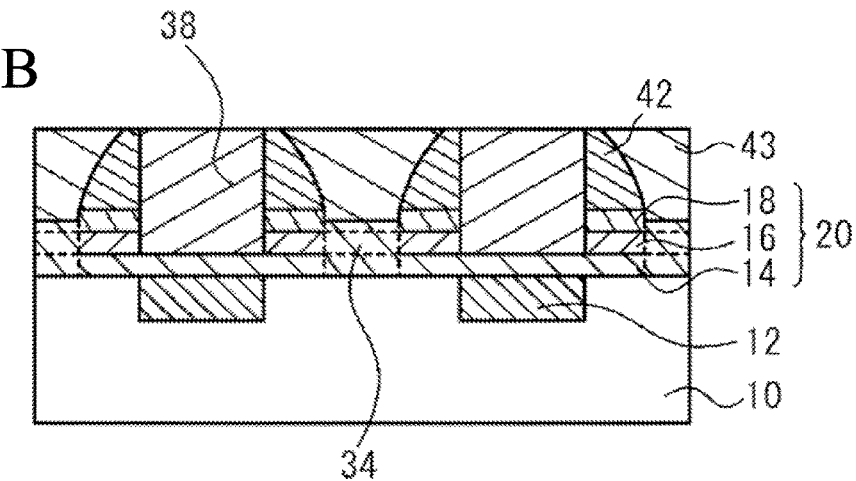
Figure 18C:
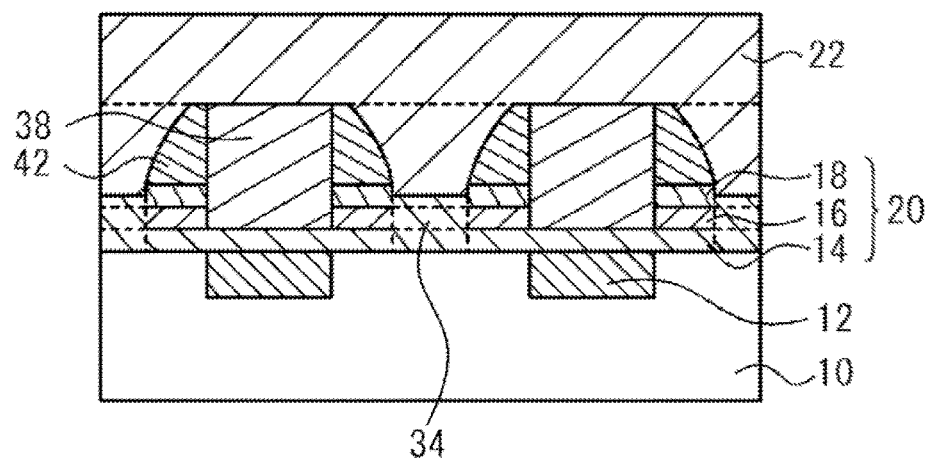

Next, using FIG. 18A to FIG. 18C, a manufacturing method of the flash memory according to the modified example of the second embodiment is described. Except that the mask layer 40 is formed of a silicon nitride film and the hole portion 41 is formed by etching the mask layer 40, the top oxide film 18, and the trap layer 16, the processes up to forming the insulating film 38 are the same as those of the second embodiment and shown in FIG. 15A to FIG. 15C; therefore, their description is omitted. With reference to FIG. 18A, after removing the mask layer 40 by wet etching using a phosphoric acid solution, a polysilicon film is formed on the ONO film 20 to cover the insulating film 38. After that, a polysilicon film is etched using for example the RIE method to form the first sidewall layer 42 made of the polysilicon film on the sidewall of the insulating film 38. Using the first sidewall layer 42 as a mask, the top oxide film 18 is etched. With reference to FIG. 18B, low-temperature radical oxidation is applied to the entire trap layer 16 under the etched portion of the top oxide film 18. In this way is formed the oxide film 34 made, in the middle between the bit lines 12, of the tunnel oxide film 14, the trap layer 16 which has become a silicon oxide film, and the top oxide film 18. A polysilicon film 43 is formed to cover the insulating film 38 and the first sidewall layer 42. After that, the polysilicon film 43 and the insulating film 38 are polished using the CMP method. With reference to FIG. 18C, on top of the polysilicon film 43 and the insulating film 38 is further formed the polysilicon film 43. In this way is formed the word line 22 made of the polysilicon film 43. Furthermore, the interlayer insulating film 28, the wiring layer 30, and the protection film 32 (illustration is omitted) are formed. In this way, the flash memory of the modified example according to the second embodiment is completed.

Figure 15D:
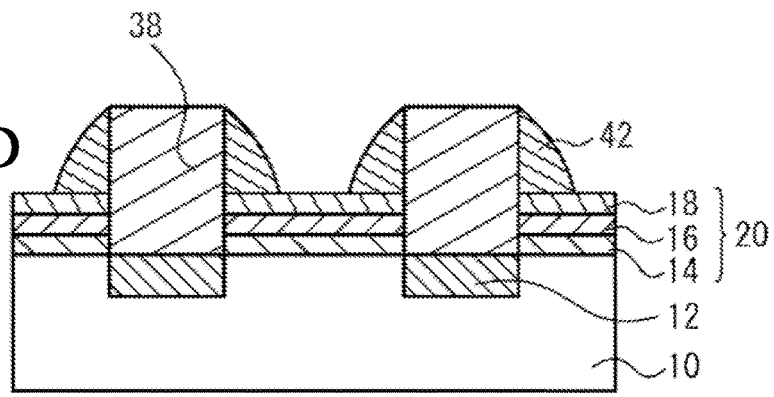

According to the modified example of the second embodiment, as shown in FIG. 18A, the mask layer 40 is removed by wet etching using a phosphoric acid solution. On the other hand, in the second embodiment, as shown in FIG. 15D, the mask layer 40 is removed by etching using the RIE method. In the second embodiment, when applying the etching using the RIE method, the top oxide film 18 may be damaged, although only slightly. If damaged, the top oxide film 18 must be repaired by, for example, thermal oxidation at 800° C., resulting in the addition of an extra manufacturing process. As in the modified example of the second embodiment, when the mask layer 40 is removed by wet etching using a phosphoric acid solution, the top oxide film 18 is not damaged, thus preventing the addition of any extra manufacturing process.

In the modified example of the second embodiment, although there has been shown an example in which the mask layer 40 is a silicon nitride film, the embodiments are not limited to this example. Especially, it is preferable that the mask layer 40 be made of a material that can be separately removed by wet etching, with the insulating film 38 and the ONO film 20 kept remaining.

Third Embodiment

Figure 19:
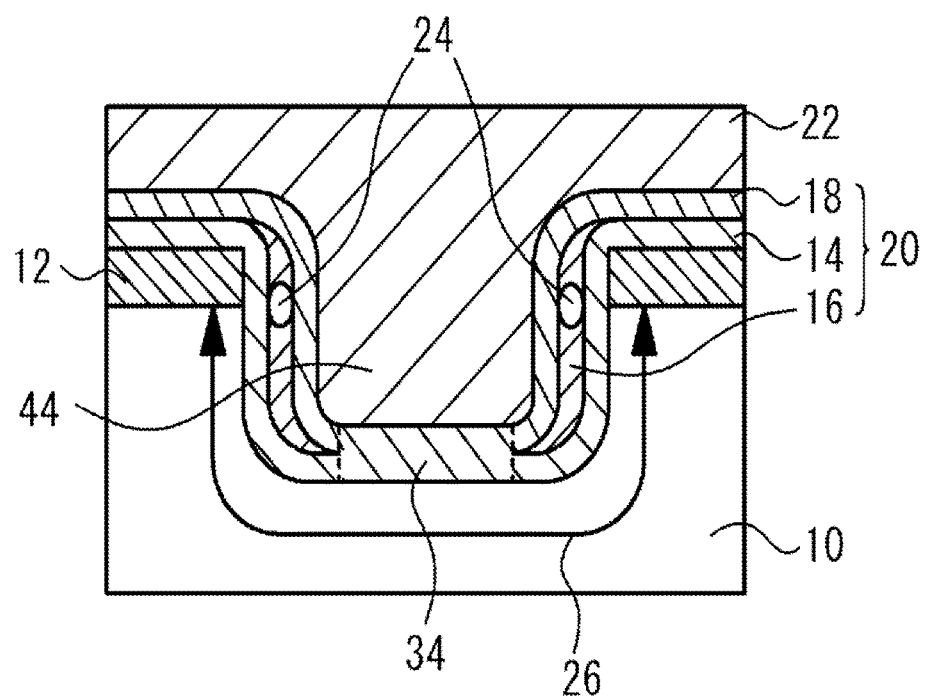
FIG. 19 is a cross-sectional view of a flash memory according to a third embodiment.

FIG. 19 is a cross-sectional view of a flash memory according to a third embodiment in the place corresponding to section A-A in FIG. 2A. With reference to FIG. 19, in the semiconductor substrate 10 between the bit lines 12 provided in the semiconductor substrate 10, a groove portion 44 is provided. Along the inner surface of the groove portion 44 is provided an ONO film 20, and on the bottom face of the groove portion 44 is provided the oxide film 34. By the oxide film 34 provided on the bottom face of the groove portion 44, the trap layer 16 is separated. Since the other configuration is the same as that of the first embodiment and shown in FIG. 2A to FIG. 2C, its description is omitted.

Figure 20A:
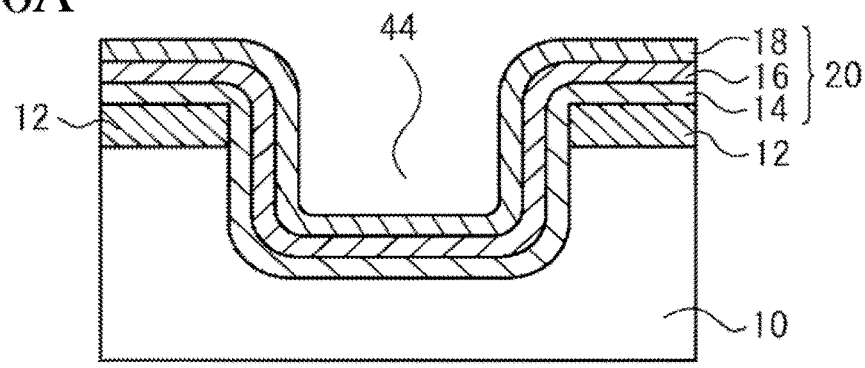
FIG. 20A to FIG. 20C are cross-sectional views showing a manufacturing process of a flash memory according to the third embodiment.
Figure 20B:
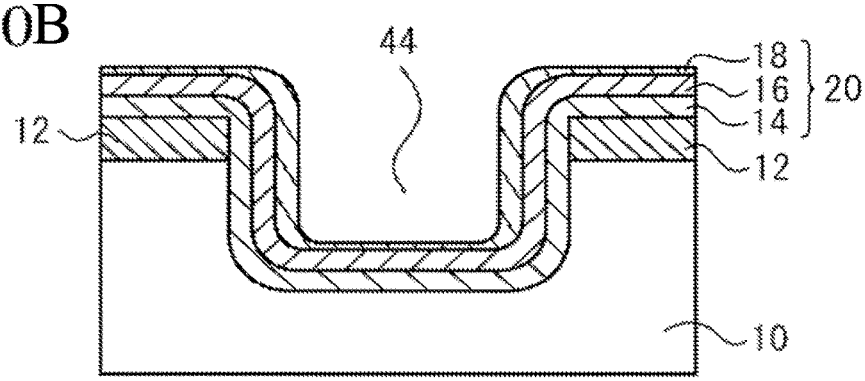
Figure 20C:
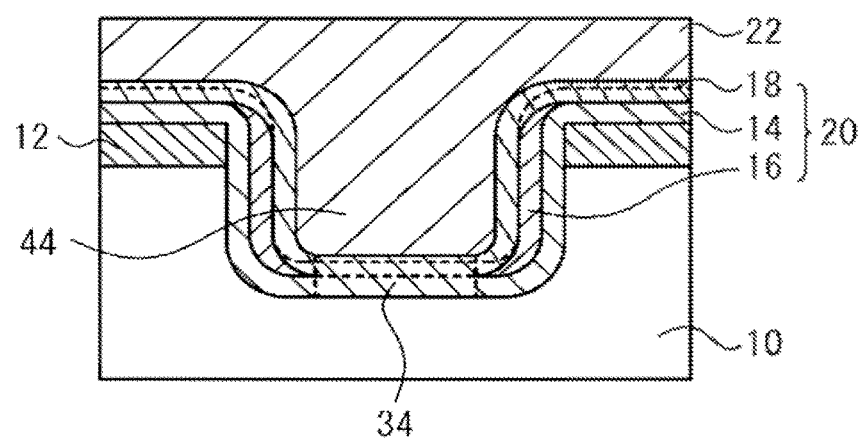

Next, using FIG. 20A to FIG. 20C, a manufacturing method of the flash memory according to the third embodiment is described. Since the process to form the bit line 12 in the semiconductor substrate 10 is the same as those of the first embodiment and shown in FIG. 5A, its description is omitted. With reference to FIG. 20A, using a photoresist formed into a prescribed pattern, the groove portion 44 that contacts the bit lines 12 is formed by etching the semiconductor substrate 10 between the bit lines 12 using the RIE method. Along the inner surface of the groove portion 44, the tunnel oxide film 14 made of a silicon oxide film, the trap layer 16 made of a silicon nitride film, and the top oxide film 18 made of a silicon oxide film are formed. In this way, the ONO film 20 is formed along the inner surface of the groove portion 44. With reference to FIG. 20B, the top oxide film 18 on the bottom face of the groove portion 44 is etched using for example the RIE method, with part of the top oxide film 18 remaining to exist. With reference to FIG. 20C, low-temperature radical oxidation is applied to the entire trap layer 16 under the etched portion of the top oxide film 18 on the bottom face of the groove portion 44. In this way, on the bottom face of the groove portion 44 is formed the oxide film 34, which is made of the tunnel oxide film 14, the trap layer 16 which has become a silicon oxide film, and the top oxide film 18. The word line 22 is formed so as to contact the ONO film 20. Furthermore, the interlayer insulating film 28, the wiring layer 30, and the protection film 32 (illustration is omitted) are formed. In this way, the flash memory according to the third embodiment is completed.

According to the third Embodiment, as shown in FIG. 19, the groove portion 44 in contact with the bit lines 12 is provided in the semiconductor substrate 10 between the bit lines 12, and the ONO film 20 is provided along the inner surface of the groove portion 44. Because of this arrangement, the portion along the groove 44 between the bit lines 12 becomes the channel 26, and thus the length of the channel 26 can be kept long even when memory cells are miniaturized. Therefore, compared with the first embodiment, the third embodiment can suppress interference of electrons accumulated in two charge storage areas 24. In addition, because the bit lines 12 are provided having the groove portion 44 in between, the punch-through phenomenon, which can be generated by a hot hole effect, is unlikely to occur.

Fourth Embodiment

Figure 21:
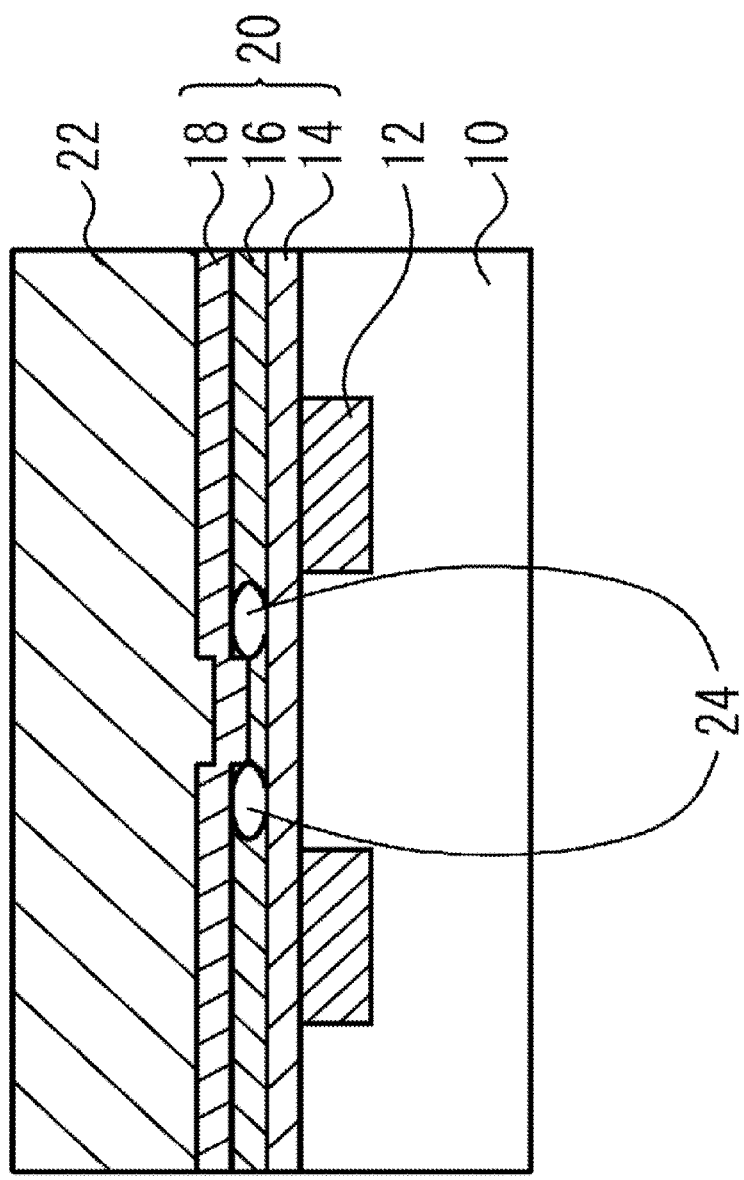
FIG. 21 is a cross-sectional view of a flash memory according to a fourth embodiment.

FIG. 21 is a cross-sectional view of a flash memory according to a fourth embodiment in the place corresponding to section A-A in FIG. 2A. With reference to FIG. 21, the bit lines 12 are provided in the semiconductor substrate 10. Along the surface of the semiconductor substrate 10, the tunnel oxide film 14 made of a silicon oxide film, the trap layer 16 made of a silicon nitride film, and the top oxide film 18 made of a silicon oxide film are provided in this order. This means that the ONO film 20 is provided along the surface of the semiconductor substrate 10. The film thickness of the trap layer 16 in the middle between the bit lines 12 is less than that of the trap layer 16 at the portion in contact with the bit line 12. The EOT of the ONO film 20 in the middle between the bit lines 12 is the same as the EOT of the ONO film 20 in contact with the bit line 12. The word line 22 is provided so as to contact the ONO film 20.

Since the manufacturing method of the flash memory according to the fourth embodiment is the same as that of the first embodiment, as shown in FIG. 4A to FIG. 5B, except that the low-temperature radical oxidation is applied so that part of the trap layer 16 in the middle between the bit lines 12 remains to exist, its description is omitted.

According to the fourth embodiment, as shown in FIG. 21, the film thickness of the trap layer 16 in the middle between the bit lines 12 is less than that of the trap layer 16 at the portion in contact with the bit line 12. Because of this arrangement, the number of electrons that can be stored in the trap layer 16 in the middle between the bit lines 12 is very small. Therefore, compared with related-art examples, it is possible to mitigate the influence of the interference between the electrons accumulated in two charge storage areas 24.

Moreover, according to the fourth embodiment, because the low-temperature radical oxidation is applied so that the trap layer 16 under the etched portion of the top oxide film 18 partly remains to exist, the time for the low-temperature radical oxidation can be shortened compared with the first embodiment, in which the entire trap layer 16 is oxidized by low-temperature radical oxidation. As a result, the manufacturing time can be shortened.

In the fourth embodiment, although there has been shown an example in which the EOT of the ONO film 20 in the middle between the bit lines 12 is the same as the EOT of the ONO film 20 in contact with the bit line 12, embodiments are not limited to this example. If the film thickness of the trap layer 16 in the middle between the bit lines 12 is sufficiently small, the interference of electrons accumulated in the charge storage areas 24 can be mitigated.

Furthermore, also in the fourth embodiment, as in the modified example of the first embodiment, the width of the trap layer 16 in the middle between the bit lines 12 can be reduced by applying low-temperature radical oxidation to the trap layer 16 using the second sidewall layer 36 as a mask. As in the second embodiment, it is also possible to provide above the bit line 12 the insulating film 38 that penetrates the ONO film 20 and has a film thickness larger than that of the ONO film 20.

Fifth Embodiment

Figure 22:
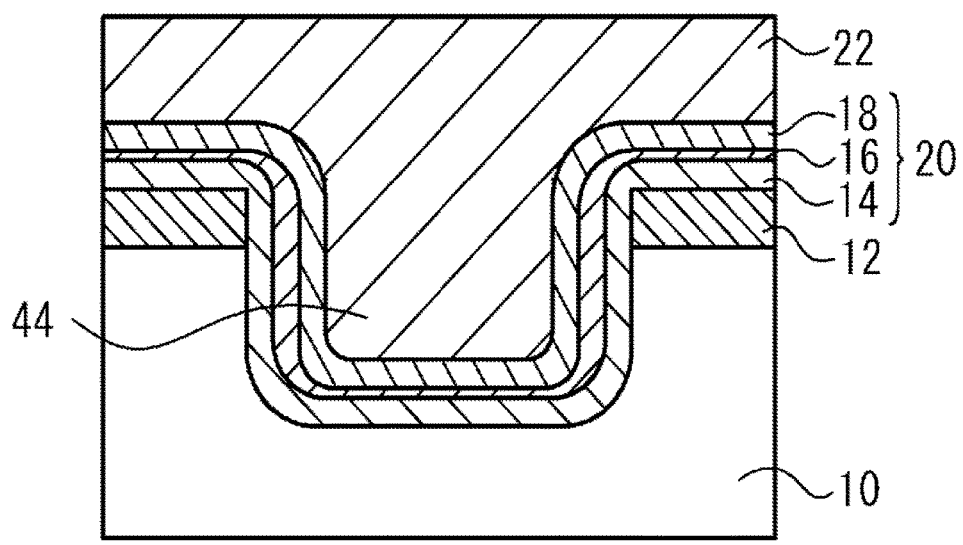
FIG. 22 is a cross-sectional view of a flash memory according to a fifth embodiment.

FIG. 22 is a cross-sectional view of a flash memory according to a fifth embodiment in the place corresponding to section A-A in FIG. 2A. With reference to FIG. 22, the groove portion 44 is provided in the semiconductor substrate 10 between the bit lines 12. Along the inner surface of the groove portion 44 is provided the ONO film 20. The film thickness of the trap layer 16 provided on the bottom face of the groove portion 44 is less than that of the trap layer 16 provided on the side face of the groove portion 44 in contact with the bit line 12. Since the other configuration is the same as that of the fourth embodiment and shown in FIG. 21, its description is omitted.

Since the manufacturing method of the flash memory according to the fifth embodiment is the same as that of the third embodiment, as shown in FIG. 20A to FIG. 20C, except that the low-temperature radical oxidation is applied so that part of the trap layer 16 on the bottom face of the groove portion 44 remains to exist, its description is omitted.

Finally, various aspects of the present invention are summarized below.

According to an aspect of the present invention, there is provided a semiconductor device including: a semiconductor substrate; bit lines provided in the semiconductor substrate; an ONO film that is provided along a surface of the semiconductor substrate and includes a tunnel oxide film, a trap layer made of a nitride film, and a top oxide film; and an oxide film that is provided on the surface of the semiconductor substrate in a middle portion between the bit lines along the surface of the semiconductor substrate and contacts a side face of the ONO film. The film thickness of the oxide film is larger than the sum of the thicknesses of the tunnel oxide film and the top oxide film, and smaller than the thickness of the ONO film. According to the present invention, interference of electrons accumulated in a charge storage area can be suppressed, and electrons can be removed from a charge storage layer by the F-N tunnel effect. Therefore, high integration and miniaturization of memory cells become possible.

In the above configuration, it can be configured to include on the bit lines an insulating film that penetrates the ONO film and has a film thickness larger than that of the ONO film.

In the above configuration, it can be configured to include a portion defining a groove that is provided in an area in the semiconductor substrate between the bit lines and contacts the bit lines, and the ONO film is provided along an inner surface of the groove. According to this configuration, the length of a channel can be increased. Therefore, higher integration and more miniaturization of memory cells become possible.

In the above configuration, it can be configured such that the film thickness of the oxide film is the same as the equivalent oxide-film thickness of the ONO film. According to this configuration, the electric field intensity applied to the oxide film and the trap layer can be made uniform when electrons are removed from a charge storage layer using the F-N tunnel effect. Therefore, electrons can be efficiently removed from the charge storage layer.

According to another aspect of the present invention, there is provided a semiconductor device including: a semiconductor substrate; bit lines provided in the semiconductor substrate; and an ONO film that is provided along a surface of the semiconductor substrate and includes a tunnel oxide film, a trap layer made of a nitride film, and a top oxide film. The film thickness of the trap layer in a middle portion between the bit lines along the surface of the semiconductor substrate is smaller than the thickness of the trap layer in portions in contact with the bit lines. According to this aspect of the present invention, the amount of electrons accumulated in the trap layer in the middle between the bit lines can be reduced. Therefore, interference of electrons accumulated in a charge storage area can be mitigated.

In the above configuration, it can be configured to include on the bit lines an insulating film that penetrates the ONO film and has a film thickness larger than that of the ONO film.

In the above configuration, it can be configured to include a portion defining a groove that is provided in an area in the semiconductor substrate between the bit lines and contacts the bit lines, and the ONO film is provided along an inner surface of the groove. According to this configuration, the length of a channel can be increased. Therefore, higher integration and more miniaturization of memory cells become possible.

In the above configuration, it can be configured such that the equivalent oxide-film thickness of the ONO film in the middle portion between the bit lines is the same as the equivalent oxide-film thickness of the ONO film in the portions in contact with the bit lines. Moreover, in the above configuration, it can be configured to include a word line provided to contact the ONO film.

According to yet another aspect of the present invention, there is provided a manufacturing method of a semiconductor device including: forming bit lines in a semiconductor substrate; forming along a surface of the semiconductor substrate an ONO film that includes a tunnel oxide film, a trap layer made of a nitride film, and a top oxide film; etching the top oxide film in a middle portion between the bit lines along the surface of the semiconductor substrate; and oxidizing the trap layer under a portion where the top oxide film is etched. According to this aspect of the present invention, it is easy to form in the middle between the bit lines an oxide film whose thickness is larger than the sum of the thicknesses of the tunnel oxide film and the top oxide film and smaller than the thickness of the ONO film.

In the above configuration, it can be configured to include forming in an area in the semiconductor substrate between the bit lines a portion defining a groove that contacts the bit lines, and the ONO film is formed along an inner surface of the groove. According to this configuration, a semiconductor device having a large channel length can be obtained.

According to a further aspect of the present invention, there is provided a manufacturing method of a semiconductor device including: forming on a surface of a semiconductor substrate an ONO film that includes a tunnel oxide film, a trap layer made of a nitride film, and a top oxide film; forming a mask layer on the ONO film; forming bit lines in the semiconductor substrate using the mask layer as a mask; forming on the bit lines an insulating film that is penetrating the ONO film, defined by the mask layer, and thicker than the ONO film; etching the top oxide film using as a mask a first sidewall layer provided on a sidewall of the insulating film on the ONO film; and oxidizing the trap layer under a portion where the top oxide film is etched. According to this aspect of the present invention, it is possible to form an oxide film self-aligned to the bit lines whose thickness is larger than the sum of the thicknesses of the tunnel oxide film and the top oxide film and smaller than the thickness of the ONO film.

In the above configuration, it can be configured such that the mask layer is a silicon nitride film. According to this configuration, the mask layer can be removed without damaging the top oxide film because the mask layer can be removed by wet etching.

In the above configuration, it can be configured such that the mask layer is a polysilicon film.

In the above configuration, it can be configured such that oxidizing the trap layer includes oxidizing the trap layer using as a mask a second sidewall layer formed on a sidewall of the top oxide film. According to this configuration, the width of the oxide film can be reduced. Therefore, the charge storage area can be widened even when memory cells are highly integrated and miniaturized.

In the above configuration, it can be configured such that oxidizing the trap layer is a process oxidizing the trap layer through low-temperature radical oxidation. According to this configuration, oxidation of the trap layer can be performed through the top oxide film at a high rate of oxidation.

In the above configuration, it can be configured such that oxidizing the trap layer is a process entirely oxidizing the trap layer. According to this configuration, interference of electrons accumulated in the charge storage area can be suppressed, and electrons can be removed from the charge storage layer by the F-N tunnel effect.

In the above configuration, it can be configured such that oxidizing the trap layer is a process oxidizing the trap layer with part of the trap layer remaining. According to this configuration, interference of electrons accumulated in the charge storage area can be mitigated because the amount of electrons accumulated in the trap layer in the middle between the bit lines can be reduced.

In the above configuration, it can be configured such that etching the top oxide film is a process etching the top oxide film so that part of the top oxide film remains, and the formula $D=A/2$ is satisfied where D is an etching amount of the top oxide film and A is an oxidation amount of the trap layer. According to this configuration, the equivalent oxide-film thickness can be uniform.

In the above configuration, it can be configured such that etching the top oxide film is a process entirely etching the top oxide film, and the formula $T=A$ is satisfied where T is the thickness of the top oxide film and A is an oxidation amount of the trap layer. According to this configuration, the equivalent oxide-film thickness can be uniform.

Although embodiments of the present invention are described in detail above, the present invention is not to be limited to these particular embodiments, but various modifications and changes can be made within the scope of gist of the present invention.

What is claimed is:

1. A method for manufacturing a semiconductor device, comprising:
   forming a bit line in a semiconductor substrate;
   forming along a surface of the semiconductor substrate an oxide-nitride-oxide (ONO) film that includes a tunnel oxide film, a trap layer made of a nitride film, and a top oxide film;
   etching the top oxide film in a middle portion between the bit lines along the surface of the semiconductor substrate; and
   oxidizing the trap layer under a portion where the top oxide film is etched.

2. The method for manufacturing a semiconductor device according to claim 1, further comprising:
   forming in an area in the semiconductor substrate between the bit lines a portion defining a groove that contacts the bit line;
   wherein the ONO film is formed along an inner surface of the groove.

3. The method for manufacturing a semiconductor device according to claim 1, wherein oxidizing the trap layer includes oxidizing the trap layer using as a mask a second sidewall layer formed on a sidewall of the top oxide film.

4. The method for manufacturing a semiconductor device according to claim 1, wherein oxidizing the trap layer comprises oxidizing the trap layer through low temperature radical oxidation.

5. The method for manufacturing a semiconductor device according to claim 1, wherein oxidizing the trap layer comprises entirely oxidizing the trap layer.

6. The method for manufacturing a semiconductor device according to claim 1, wherein oxidizing the trap layer comprises oxidizing the trap layer with a portion of the trap layer remaining.

7. The method for manufacturing a semiconductor device according to claim 1, wherein etching the top oxide film comprises etching the top oxide film so that part of the top oxide film remains.

8. The method for manufacturing a semiconductor device according to claim 7, wherein an etching amount of the top oxide film is substantially equal to an oxidation amount of the trap layer.

9. The method for manufacturing a semiconductor device according to claim 1, wherein etching the top oxide film comprises entirely etching the top oxide film.

10. The method for manufacturing a semiconductor device according to claim 9, wherein a thickness of the top oxide film is substantially equal to an oxidation amount of the trap layer.

11. A method for manufacturing a semiconductor device, comprising:
    forming on a surface of a semiconductor substrate an oxide-nitride-oxide (ONO) film that includes a tunnel oxide film, a trap layer made of a nitride film, and a top oxide film;
    forming a mask layer on the ONO film;
    forming a bit line in the semiconductor substrate using the mask layer as a mask;
    forming on the bit line an insulating film that is penetrating the ONO film, defined by the mask layer, and thicker than the ONO film;
    etching the top oxide film using as a mask a first sidewall layer provided on a sidewall of the insulating film on the ONO film; and
    oxidizing the trap layer under a portion where the top oxide film is etched.

12. The method for manufacturing a semiconductor device according to claim 11, wherein the mask layer is a silicon nitride film.

13. The method for manufacturing of a semiconductor device according to claim 11, wherein the mask layer is a polysilicon film.

14. The method for manufacturing a semiconductor device according to claim 11, wherein oxidizing the trap layer comprises oxidizing the trap layer through low temperature radical oxidation.

15. The method for manufacturing a semiconductor device according to claim 11, wherein oxidizing the trap layer comprises entirely oxidizing the trap layer.

16. The method for manufacturing a semiconductor device according to claim 11, wherein oxidizing the trap layer comprises oxidizing the trap layer with a portion of the trap layer remaining.

17. The method for manufacturing a semiconductor device according to claim 11, wherein etching the top oxide film comprises etching the top oxide film so that part of the top oxide film remains.

18. The method for manufacturing a semiconductor device according to claim 17, wherein an etching amount of the top oxide film is substantially equal to an oxidation amount of the trap layer.

19. The method for manufacturing a semiconductor device according to claim 11, wherein etching the top oxide film comprises entirely etching the top oxide film.

20. The method for manufacturing a semiconductor device according to claim 19, wherein a thickness of the top oxide film is substantially equal to an oxidation amount of the trap layer.

* * * * *